US012772593B2

(12) United States Patent
Liu et al.

(10) Patent No.: US 12,772,593 B2
(45) Date of Patent: Oct. 20, 2026

(54) SENSING DEVICE AND METHOD FOR MANUFACTURING SENSING DEVICE

(71) Applicant: InnoLux Corporation, Miao-Li County (TW)

(72) Inventors: Yu-Tsung Liu, Miao-Li County (TW); Te-Yu Lee, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 926 days.

(21) Appl. No.: 17/818,093

(22) Filed: Aug. 8, 2022

(65) Prior Publication Data

US 2023/0070134 A1 Mar. 9, 2023

(30) Foreign Application Priority Data

Sep. 3, 2021 (CN) ........................ 202111030928.0
Apr. 13, 2022 (CN) ........................ 202210386611.9

(51) Int. Cl.
*H10F 39/00* (2025.01)
*H10F 39/12* (2025.01)

(52) U.S. Cl.
CPC ......... *H10F 39/811* (2025.01); *H10F 39/014* (2025.01); *H10F 39/024* (2025.01); (Continued)

(58) Field of Classification Search
CPC .... H10F 39/811; H10F 39/014; H10F 39/024; H10F 39/198; H10F 39/8057; H10F 39/8063
See application file for complete search history.

(56) References Cited

U.S. PATENT DOCUMENTS 5,514,888 A * 5/1996 Sano .................. H10F 39/8057 438/69
11,139,404 B2 10/2021 Chang et al.
(Continued)

FOREIGN PATENT DOCUMENTS

CN 109671729 A 4/2019
CN 211427368 U 9/2020
(Continued)

OTHER PUBLICATIONS

Chinese language office action dated Mar. 6, 2023, issued in application No. TW 111113994.
(Continued)

*Primary Examiner* — Thanh Y. Tran
(74) *Attorney, Agent, or Firm* — McClure, Qualey & Rodack, LLP

(57) ABSTRACT

A sensing device is provided. The sensing device includes a substrate, a first electrode, a sensing element and a second electrode. The first electrode is disposed on the substrate. The sensing element is disposed on the first electrode. The sensing element is electrically connected to the first electrode. The sensing element includes a plurality of sensing units that are separate from each other. The second electrode is disposed on the sensing element and is electrically connected to the plurality of sensing units. In addition, at least one of the first electrode and the second electrode includes a hollow area, and the hollow area overlaps with a pitch between the plurality of sensing units. A method for manufacturing a sensing device is also provided.

16 Claims, 13 Drawing Sheets

(52) U.S. Cl.
CPC ....... *H10F 39/198* (2025.01); *H10F 39/8057* (2025.01); *H10F 39/8063* (2025.01)

(56) References Cited

U.S. PATENT DOCUMENTS

| | | | |
|---|---|---|---|
| 11,302,741 B2 | 4/2022 | Mittra et al. | |
| 2009/0045321 A1* | 2/2009 | Bae | H10F 39/014 257/443 |
| 2020/0200925 A1 | 6/2020 | Jeon et al. | |

FOREIGN PATENT DOCUMENTS

| | | |
|---|---|---|
| CN | 113257843 A | 8/2021 |
| TW | 202032803 A | 9/2020 |
| TW | 202131030 A | 8/2021 |

OTHER PUBLICATIONS

Chinese language office action dated Jul. 19, 2025, issued in application No. CN 202210386611.9.

* cited by examiner

SENSING DEVICE AND METHOD FOR MANUFACTURING SENSING DEVICE

CROSS REFERENCE TO RELATED APPLICATIONS

This application claims the benefit of China Application No. 202210386611.9, filed Apr. 13, 2022, which claims the benefit of China Application No. 202111030928.0, filed Sep. 3, 2021, the entirety of which are incorporated by reference herein.

BACKGROUND

Technical Field

The present disclosure is related to a sensing device, and in particular it is related to a structural design that can improve the sensitivity of a sensing device, and a method for manufacturing such a sensing device.

Description of the Related Art

Optical sensing devices are widely used in consumer electronics such as smartphones and wearable devices etc., and have become indispensable necessities in modern society. With the flourishing development of such consumer electronics, consumers have high expectations regarding the quality, functionality, or price of these products.

The sensing element in an optical sensing device converts received light into an electrical signal, which can be transmitted to the driving element and logic circuit in the optical sensing device for processing and analysis.

In order to improve the performance of the sensing device, the development of a structural design and method for manufacturing a sensing device that can improve the sensitivity of the sensing element is one of the current research topics in the industry.

SUMMARY

In accordance with some embodiments of the present disclosure, a sensing device is provided. The sensing device includes a substrate, a first electrode, a sensing element, and a second electrode. The first electrode is disposed on the substrate. The sensing element is disposed on the first electrode and is electrically connected to the first electrode. The second electrode is disposed on the sensing element and is electrically connected to the sensing element. Moreover, the second electrode includes a first aperture, and the first aperture overlaps with the sensing element.

In accordance with some embodiments of the present disclosure, a sensing device is provided. The sensing device includes a substrate, a first electrode, a sensing element and a second electrode. The first electrode is disposed on the substrate. The sensing element is disposed on the first electrode. The sensing element is electrically connected to the first electrode. The sensing element includes a plurality of sensing units that are separate from each other. The second electrode is disposed on the sensing element. The second electrode is electrically connected to the plurality of sensing units. In addition, at least one of the first electrode and the second electrode includes a hollow area, and the hollow area overlaps with a pitch between the plurality of sensing units.

In accordance with some embodiments of the present disclosure, a method for manufacturing a sensing device is provided. The method includes the following steps: providing a substrate; forming a first electrode on the substrate; forming a sensing element on the first electrode, and the sensing element is electrically connected to the first electrode; and forming a second electrode on the sensing element, and the second electrode is electrically connected to the sensing element. Moreover, the second electrode includes a first aperture, and the first aperture overlaps with the sensing element.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein.

DETAILED DESCRIPTION

Figure 1A:
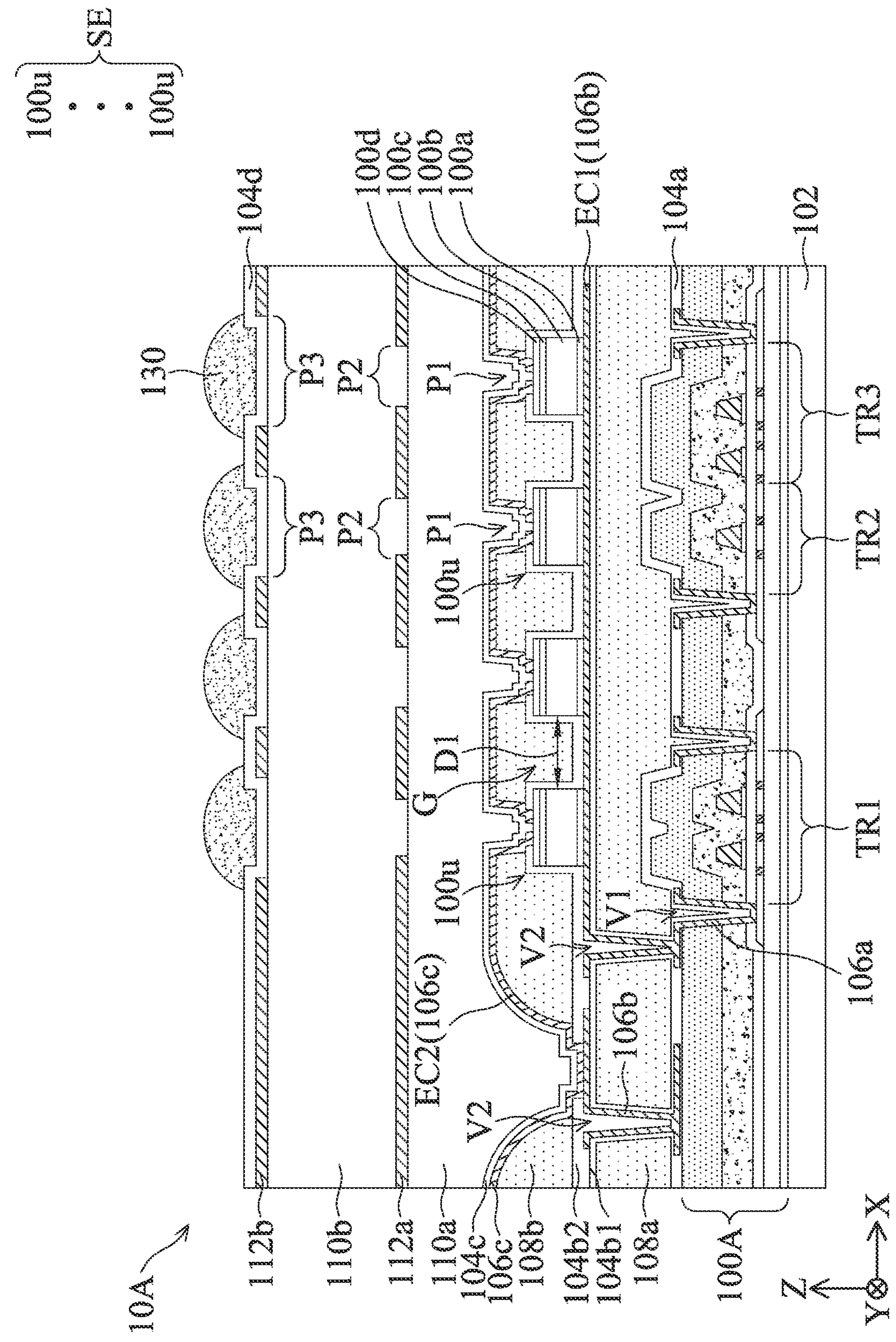
FIG. 1A is a cross-sectional diagram of a sensing device in accordance with some embodiments of the present disclosure.

The sensing device and the method for manufacturing the sensing device according to the present disclosure are described in detail in the following description. It should be understood that in the following detailed description, for purposes of explanation, numerous specific details and embodiments are set forth in order to provide a thorough understanding of the present disclosure. The elements and configurations described in the following detailed description are set forth in order to clearly describe the present disclosure. These embodiments are used merely for the purpose of illustration, and the present disclosure is not limited thereto. In addition, different embodiments may use like and/or corresponding numerals to denote like and/or corresponding elements in order to clearly describe the present disclosure. However, the use of like and/or corresponding numerals of different embodiments does not suggest any correlation between different embodiments.

It should be understood that relative expressions may be used in the embodiments. For example, "lower", "bottom", "higher" or "top" are used to describe the position of one element relative to another. It should be appreciated that if a device is flipped upside down, an element that is "lower" will become an element that is "higher". The present disclosure can be understood by referring to the following detailed description in connection with the accompanying drawings. The drawings are also regarded as part of the description of the present disclosure. It should be understood that the drawings of the present disclosure may be not drawn to scale. In fact, the size of the elements may be arbitrarily enlarged or reduced to clearly represent the features of the present disclosure.

Furthermore, the expression "a first material layer is disposed on or over a second material layer" may indicate that the first material layer is in direct contact with the second material layer, or it may indicate that the first material layer is in indirect contact with the second material layer. In the situation where the first material layer is in indirect contact with the second material layer, there may be one or more intermediate layers between the first material layer and the second material layer. However, the expression "the first material layer is directly disposed on or over the second material layer" means that the first material layer is in direct contact with the second material layer, and there is no intermediate element or layer between the first material layer and the second material layer.

Moreover, it should be understood that the ordinal numbers used in the specification and claims, such as the terms "first", "second", etc., are used to modify an element, which itself does not mean and represent that the element (or elements) has any previous ordinal number, and does not mean the order of a certain element and another element, or the order in the manufacturing method. The use of these ordinal numbers is to make an element with a certain name can be clearly distinguished from another element with the same name. Claims and the specification may not use the same terms. For example, the first element in the specification may refer to the second element in the claims.

In accordance with the embodiments of the present disclosure, regarding the terms such as "connected to", "interconnected with", etc. referring to bonding and connection, unless specifically defined, these terms mean that two structures are in direct contact or two structures are not in direct contact, and other structures are provided to be disposed between the two structures. The terms for bonding and connecting may also include the case where both structures are movable or both structures are fixed. In addition, the term "electrically connected to" or "electrically coupled to" may include any direct or indirect electrical connection means.

In the following descriptions, terms "about" and "substantially" typically mean +/−10% of the stated value, or typically +/−5% of the stated value, or typically +/−3% of the stated value, or typically +/−2% of the stated value, or typically +/−1% of the stated value or typically +/−0.5% of the stated value. The expression "in a range from the first value to the second value" or "between the first value and the second value" means that the range includes the first value, the second value, and other values in between.

It should be understood that in the following embodiments, without departing from the spirit of the present disclosure, the features in several different embodiments can be replaced, recombined, and mixed to complete another embodiment. The features between the various embodiments can be mixed and matched arbitrarily as long as they do not violate or conflict the spirit of the present disclosure.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

The sensitivity of a sensing element is affected by quantum efficiency and photoelectric conversion efficiency, and the photoelectric conversion efficiency is mainly affected by the equivalent capacitance of the sensing element. Sensing devices usually integrate thin-film transistors, sensing elements (e.g., photodiodes), and optical elements (e.g., elements with a collimator function) therein, and a large number of photomasks are required in the manufacture and the process is complicated. Moreover, stray capacitances generated between different elements (e.g., between a photodiode and an optical element, or between a photodiode and an electrode, etc.) also affect the sensitivity of the sensing device.

In accordance with the embodiments of the present disclosure, a sensing device and a method for manufacturing the same are provided, which can integrate parts of the structures of the elements (e.g., the sensing element and the optical element) in the sensing device. Therefore, the number of photomasks used in the manufacturing process can be reduced, the process can be simplified, or the yield can be improved. Moreover, in accordance with some embodiments, the electrode design of the sensing element can be used to reduce the stray capacitance generated between different elements, thereby reducing the equivalent capacitance of the sensing element. Accordingly, the sensitivity of the sensing device can be improved, or the overall performance of the sensing device can be enhanced.

Refer to FIG. 1A, which is a cross-sectional diagram of a sensing device 10A in accordance with some embodiments of the present disclosure. It should be understood that, for clear description, some elements of the sensing device 10A are omitted in the drawings, and only some elements are schematically shown. In accordance with some embodiments, additional features may be added to the sensing device 10A described below. In accordance with some other embodiments, some of the features of the sensing device 10A described below may be replaced or omitted. Furthermore, the structure of the sensing device 10A will be described below accompanying with the method for manufacturing the sensing device 10A. It should be understood that, in accordance with some embodiments, additional steps may be added before, during, and/or after the method for manufacturing the sensing device 10A is performed. In accordance with some embodiments, some of the steps described below may be replaced or omitted. In accordance with some embodiments, the order of some of the steps described below may be interchangeable.

As shown in FIG. 1A, in accordance with some embodiments, a substrate 102 is provided. In accordance with some embodiments, a structural layer 100A may be formed on the substrate 102. In accordance with some embodiments, before forming the structure layer 100A, a buffer layer (not illustrated) may be formed on the substrate 102, and then the structure layer 100A may be formed on the buffer layer. In accordance with some embodiments, the structure layer 100A may include thin-film transistors, for example, a thin-film transistor TR1, a thin-film transistor TR2, and a thin-film transistor TR3 shown in the drawings, and the structure layer 100A may include conductive elements and signal lines that are electrically connected to the thin-film transistors, insulating layers formed between the conductive elements, and planarization layers, etc. In accordance with some embodiments, the signal lines may include, for example, current signal lines, voltage signal lines, high-frequency signal lines, and low-frequency signal lines, and the signal lines may transmit device operating voltage (VDD), common ground voltage (VSS), or the voltage of driving device terminal, but the present disclosure is not limited thereto.

In accordance with some embodiments, the thin-film transistors may include switching transistors, drive transistors, reset transistors, transistor amplifiers, or other suitable thin-film transistors. Specifically, in accordance with some embodiments, the thin-film transistor TR1 may be a reset transistor, the thin-film transistor TR2 may be a transistor amplifier or a source follower, and the thin-film transistor TR3 may be a switching transistor, but they are not limited thereto.

It should be understood that the number of the thin-film transistors is not limited to that shown in the drawings, and the sensing device 10A may include other suitable numbers or types of thin-film transistors according to different embodiments. Moreover, the type of the thin-film transistor may include a top gate thin-film transistor, a bottom gate thin-film transistor, a dual gate (or double gate) thin-film transistor, or a combination thereof. In accordance with some embodiments, the thin-film transistors may be further electrically connected to a capacitor element, but it is not limited thereto. Furthermore, the thin-film transistor may include at least one semiconductor layer, a gate dielectric layer, and a gate electrode layer. In accordance with some embodiments, the material of the semiconductor layer may include amorphous silicon, polysilicon, or metal oxide. In addition, different thin-film transistors may include different semiconductor materials. For example, the materials of the semiconductor layers of the thin-film transistor TR1 or the thin-film transistor TR3 may include metal oxides, and the material of the semiconductor layer of the thin-film transistor TR2 may include polysilicon. In accordance with some embodiments, the materials of the semiconductor layers of the thin-film transistor TR1, the thin-film transistor TR2 and the thin-film transistor TR3 all include polysilicon. The thin-film transistors may exist in various forms known to those skilled in the art, and the detailed structure of the thin-film transistors will not be repeated herein.

In accordance with some embodiments, the substrate 102 may include a flexible substrate, a rigid substrate, or a combination thereof, but it is not limited thereto. In accordance with some embodiments, the material of the substrate 102 may include glass, quartz, sapphire, ceramic, polyimide (PI), polycarbonate (PC), polyethylene terephthalate (PET), polypropylene (PP), another suitable material, or a combination thereof, but it is not limited thereto. Moreover, in accordance with some embodiments, the substrate 102 may include a metal-glass fiber composite plate, or a metal-ceramic composite plate, but it is not limited thereto. In addition, the light transmittance of the substrate 102 is not limited. That is, the substrate 102 may be a transparent substrate, a semi-transparent substrate or a non-transparent substrate.

In accordance with some embodiments, after the structure layer 100A is formed on the substrate 102, portions of the gate dielectric layer and the dielectric layer in the structure layer 100A may be removed by a patterning process to form a through-hole V1. Next, a conductive layer 106*a* may be formed in the through-hole V1, and then a passivation layer 104*a* may be formed on the conductive layer 106*a*. Then, a planarization layer 108*a* may be formed over the structure layer 100A, and the planarization layer 108*a* may cover the aforementioned conductive layer 106*a* and the passivation layer 104*a*. In addition, the planarization layer 108*a* may cover the thin-film transistor TR1, the thin-film transistor TR2 and the thin-film transistor TR3. Next, a portion of the planarization layer 108*a* may be removed by a patterning process to form a through-hole V2, and then a passivation layer 104*b*1 may be formed on the planarization layer 108*a* and in the through-hole V2. Then, a conductive layer 106*b* may be formed on the passivation layer 104*b*1 and in the through-hole V2. As shown in FIG. 1A, a portion of the conductive layer 106*b* may penetrate through the planarization layer 108*a* to be electrically connected to the conductive layer 106*a*, and the conductive layer 106*a* may penetrate through, for example, the gate dielectric layer (not labeled) and the dielectric layer (not labeled) to be electrically connected to the semiconductor layer of the thin-film transistor TR1.

In accordance with some embodiments, the passivation layer 104*a* and the passivation layer 104*b*1 may have a single-layer or multi-layer structure, and the materials of the passivation layer 104*a* and the passivation layer 104*b*1 may include inorganic materials, organic materials, or a combination thereof, but they are not limited thereto. For example, the inorganic material may include, but is not limited to, silicon nitride, silicon oxide, silicon oxynitride, another suitable material, or a combination thereof. For example, the organic material may include, but is not limited to, polyethylene terephthalate (PET), polyethylene (PE), polyethersulfone (PES), polycarbonate (PC), polymethylmethacrylate (PMMA), polyimide (PI), another suitable material, or a combination thereof.

In accordance with some embodiments, the passivation layer 104*a* and the passivation layer 104*b*1 may be formed by a coating process, a chemical vapor deposition process, a physical vapor deposition process, a printing process, an evaporation process, a sputtering process, another suitable process, or a combination thereof. For example, the chemical vapor deposition process may include a low-pressure chemical vapor deposition (LPCVD) process, a low-temperature chemical vapor deposition (LTCVD) process, a rapid thermal chemical vapor deposition (RTCVD) process, a plasma enhanced chemical vapor deposition (PECVD) process or an atomic layer deposition (ALD) process, etc., but it is not limited thereto. For example, the physical vapor deposition process may include a sputtering process, an evaporation process, or a pulsed laser deposition, etc., but it is not limited thereto.

In accordance with some embodiments, the conductive layer 106*a* and the conductive layer 106*b* may include conductive materials, such as metal materials, transparent conductive materials, other suitable conductive materials, or a combination thereof, but they are not limited thereto. The metal material may include, for example, copper (Cu), silver (Ag), gold (Au), tin (Sn), aluminum (Al), molybdenum (Mo), tungsten (W), chromium (Cr), nickel (Ni), platinum (Pt), titanium (Ti), alloys of the foregoing metals, another suitable material, or a combination thereof, but it is not limited thereto. The transparent conductive material may include a transparent conductive oxide (TCO); for example, it may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto.

In accordance with some embodiments, the conductive layer 106*a* and the conductive layer 106*b* may be formed by a chemical vapor deposition process, a physical vapor deposition process, an electroplating process, an electroless plating process, another suitable process, or a combination thereof.

In accordance with some embodiments, the material of the planarization layer 108*a* may include an organic material, an inorganic material, another suitable material, or a combination thereof, but it is not limited thereto. For example, the inorganic material may include, but is not limited to, silicon nitride, silicon oxide, silicon oxynitride, aluminum oxide, another suitable material, or a combination thereof. For example, the organic material may include, but is not limited to, epoxy resins, silicone resins, acrylic resins (e.g., polymethylmethacrylate (PMMA)), polyimide, perfluoroalkoxy alkane (PFA), another suitable material or a combination thereof.

In accordance with some embodiments, the planarization layer 108*a* may be formed by a chemical vapor deposition process, a physical vapor deposition process, a coating process, a printing process, another suitable process, or a combination thereof.

Furthermore, a portion of the gate dielectric layer, a portion of the structural layer 100A and a portion of the planarization layer 108*a* may be removed by one or more photolithography processes and/or etching processes, to respectively form through-hole V1 and through-hole V2. In accordance with some embodiments, the photolithography process may include photoresist coating (e.g., spin coating), soft baking, hard baking, mask alignment, exposure, post-exposure baking, photoresist development, washing and drying, etc., but it is not limited thereto. The etching process may include a dry etching process or a wet etching process, but it is not limited thereto.

Next, a sensing element SE may be formed on the substrate 102. Specifically, after the passivation layer 104*b*1 and the conductive layer 106*b* are formed on the planarization layer 108*a*, the sensing element SE may be formed on the conductive layer 106*b*, and a portion of the conductive layer 106*b* may serve as a first electrode EC1 and may be electrically connected to the sensing element SE. As shown in FIG. 1A, the first electrode EC1 may be disposed on the passivation layer 104*b*1, and the sensing element SE may be disposed on the first electrode EC1 and electrically connected to the first electrode EC1. The sensing element SE may be electrically connected to the thin-film transistor TR1, the thin-film transistor TR2 and the thin-film transistor TR3 through the first electrode EC1 and the conductive layer 106*a* in the structure layer 100A. The sensing element SE may receive light and convert it into an electrical signal, and the generated electrical signal may be transmitted to the structure layer 100A and processed and analyzed by the circuit elements (e.g., thin-film transistor TR1, the thin-film transistor TR2 and the thin-film transistor TR3) in the structure layer 100A. In accordance with some embodiments, the sensing element SE may include a photodiode, another element capable of converting optical and electrical signals, or a combination thereof, but it is not limited thereto.

As shown in FIG. 1A, in accordance with some embodiments, the sensing element SE may include a plurality of sensing units 100*u* that are separate from each other. Specifically, the sensing unit 100*u* may include a first doped layer 100*a*, an intrinsic layer 100*b*, a second doped layer 100*c* and a transparent conductive layer 100*d*. The intrinsic layer 100*b* may be disposed between the first doped layer 100*a* and the second doped layer 100*c*. The second doped layer 100*c* may be disposed between the intrinsic layer 100*b* and the transparent conductive layer 100*d*. The transparent conductive layer 100*d* may be disposed above the second doped layer 100*c* and electrically connected to a conductive layer 106*c*. In accordance with some embodiments, the aforementioned first electrode EC1 may serve as a pixel electrode of the sensing element SE. In addition, in accordance with some embodiments, the sensing element SE may have a P-I-N structure, an N-I-P structure or another suitable structure. When light illuminates the sensing element SE, electron-hole pairs may be generated to form a photocurrent, but it is not limited thereto. In accordance with some embodiments, the first doped layer 100*a* may be, for example, an N-type doped region, and the second doped layer 100*c* may be, for example, a P-type doped region, and they may be combined with the intrinsic layer 100*b* to form an N-I-P structure.

In accordance with some embodiments, the first doped layer 100*a*, the intrinsic layer 100*b*, the second doped layer 100*c*, and the transparent conductive layer 100*d* may be sequentially formed on the first electrode EC1. Then, portions of the materials of the first doped layer 100*a*, the intrinsic layer 100*b*, the second doped layer 100*c* and the transparent conductive layer 100*d* may be removed by one or more photolithography processes and/or etching processes to form a plurality of sensing units 100*u* of the sensing element SE, and the sensing units 100*u* are separated from each other. It should be noted that the sensing units 100*u* that are separated from each other allow the sensing element SE to be miniaturized, and therefore the equivalent capacitance of the sensing element SE can be reduced.

Specifically, there may be a gap G between the separated sensing units 100*u*, and a pitch D1 may be the distance between the separated sensing units 100*u* in a cross-section. In other words, the pitch D1 may be the distance of the gap G in a cross-section. In accordance with some embodiments, the pitch D1 may be in a range from 5 micrometers (μm) to 20 micrometers (μm) (i.e. 5 μm≤pitch D1≤20 μm), for example, 10 μm or 15 μm, but it is not limited thereto. In accordance with the embodiments of the present disclosure, the pitch D1 refers to the minimum distance between adjacent sensing units 100*u* in a direction perpendicular to a normal direction of the substrate 102 (e.g., the X direction in the drawing).

It should be understood that, in accordance with the embodiments of the present disclosure, an optical microscope (OM), a scanning electron microscope (SEM), a film thickness profiler (a-step), an ellipsometer or another suitable method may be used to measure the width, thickness or height of each element, or the pitch or distance between elements. Specifically, in accordance with some embodiments, a scanning electron microscope may be used to obtain a cross-sectional image including the elements to be measured, and the width, thickness or height of each element, or the pitch or distance between elements in the image can be measured.

In accordance with some embodiments, the materials of the first doped layer 100*a*, the intrinsic layer 100*b*, and the second doped layer 100*c* may include semiconductor materials, such as silicon or another suitable material. In accordance with some embodiments, the first doped layer 100*a*, the intrinsic layer 100*b* and the second doped layer 100*c* may be formed by an epitaxial growth process, an ion implantation process, a chemical vapor deposition process, a physical vapor deposition process, another suitable process, or a combination thereof.

In accordance with some embodiments, the material of the transparent conductive layer 100*d* may include a transparent conductive material, and the transparent conductive material may include a transparent conductive oxide (TCO). For example, the transparent conductive oxide may include indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto. The process of forming the transparent conductive layer 100*d* may be the same as or similar to the process of forming the conductive layer 106*a* or the conductive layer 106*b* described above, and thus will not be repeated herein.

After the sensing element SE is formed on the planarization layer 108*a*, a passivation layer 104*b*2 and a planarization layer 108*b* then may be formed on the conductive layer 106*b* and the sensing element SE, and the passivation layer 104*b*2 may be patterned to expose a portion of the conductive layer 106*b* and a portion of the sensing element SE. Specifically, the passivation layer 104*b*2 may be conformally formed on the sensing element SE and the conductive layer 106*b* (the first electrode EC1). Next, portions of the passivation layer 104*b*2 and the planarization layer 108*b* may be removed by one or more photolithography processes and/or etching processes to expose portions of a portion of the conductive layer 106*b* and a portion of the transparent conductive layer 100*d* of the sensing unit 100*u*.

As shown in FIG. 1A, in accordance with some embodiments, the sidewalls of the planarization layer 108*b* may not be aligned with the sidewalls of the passivation layer 104*b*2. However, in accordance with some other embodiments, the sidewalls of the planarization layer 108*b* may be substantially aligned with and the sidewalls of the passivation layer 104*b*2. Moreover, in accordance with some embodiments, the planarization layer 108*b* may have a curved profile.

In accordance with some embodiments, the material of the planarization layer 108*b* may be the same as or similar to the material of the aforementioned planarization layer 108*a*, and the process of forming the planarization layer 108*b* may be the same as or similar to the process of forming the aforementioned planarization layer 108*a*, and thus will not be repeated herein.

Next, a conductive layer 106*c* may be formed on the planarization layer 108*b*, and the conductive layer 106*c* also may be formed on the conductive layer 106*b* and the transparent conductive layer 100*d* that have been exposed, and may be electrically connected to the conductive layer 106*b* and the transparent conductive layer 100*d*. In addition, it should be noted that a portion of the conductive layer 106*c* located above the transparent conductive layer 100*d* may be removed by one or more photolithography processes and/or etching processes to form a first aperture P1, and the first aperture P1 may expose a portion of the transparent conductive layer 100*d* of the sensing element SE. In accordance with some embodiments, a portion of the conductive layer 106*c* may serve as a second electrode EC2 to be electrically connected to the sensing element SE. In accordance with some embodiments, the second electrode EC2 may be used to provide a common voltage to the sensing units 100*u* of the sensing element SE.

Figure 1B:
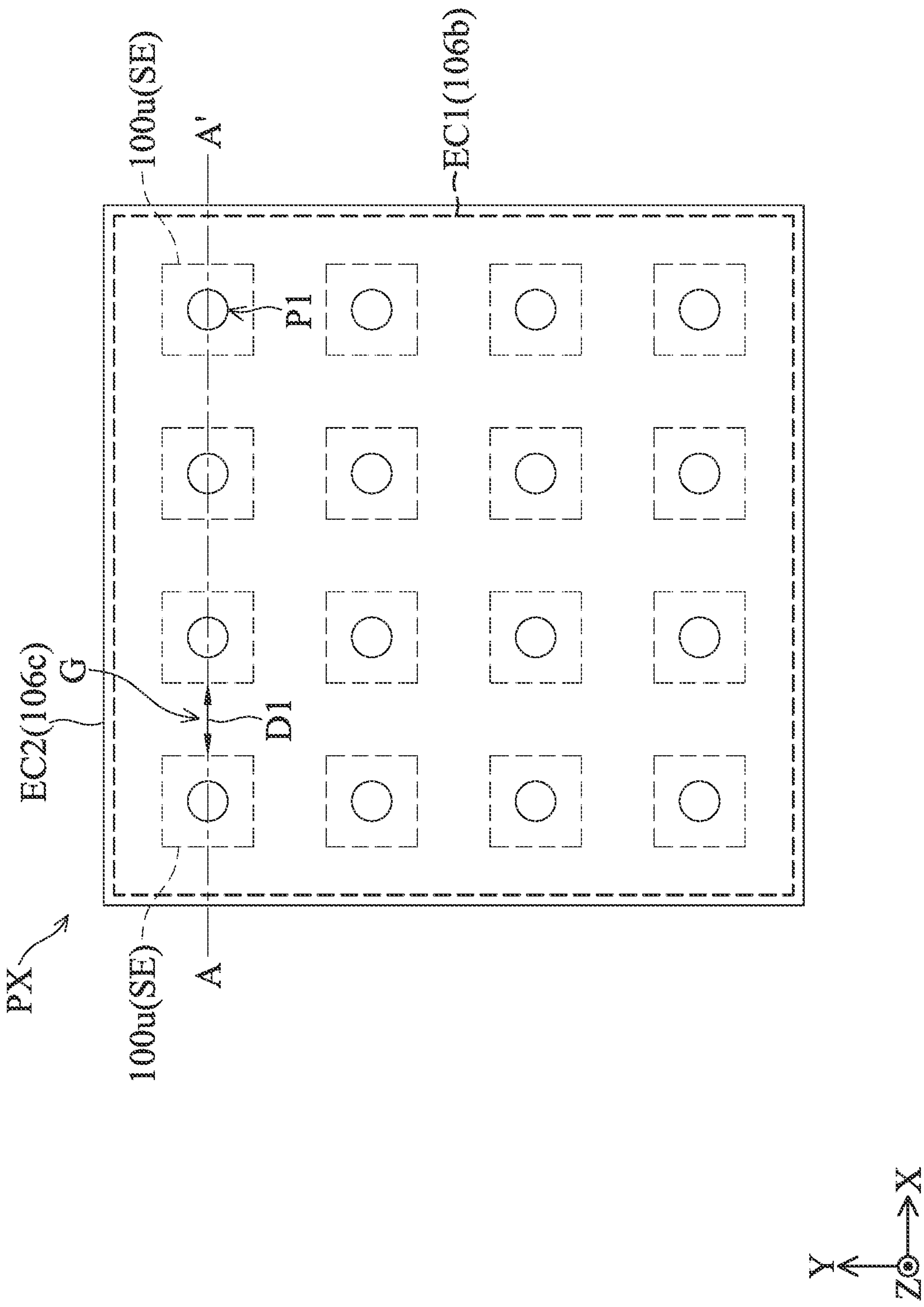
FIG. 1B is a top-view diagram of some elements of a sensing device in accordance with some embodiments of the present disclosure.
Figure 1C:
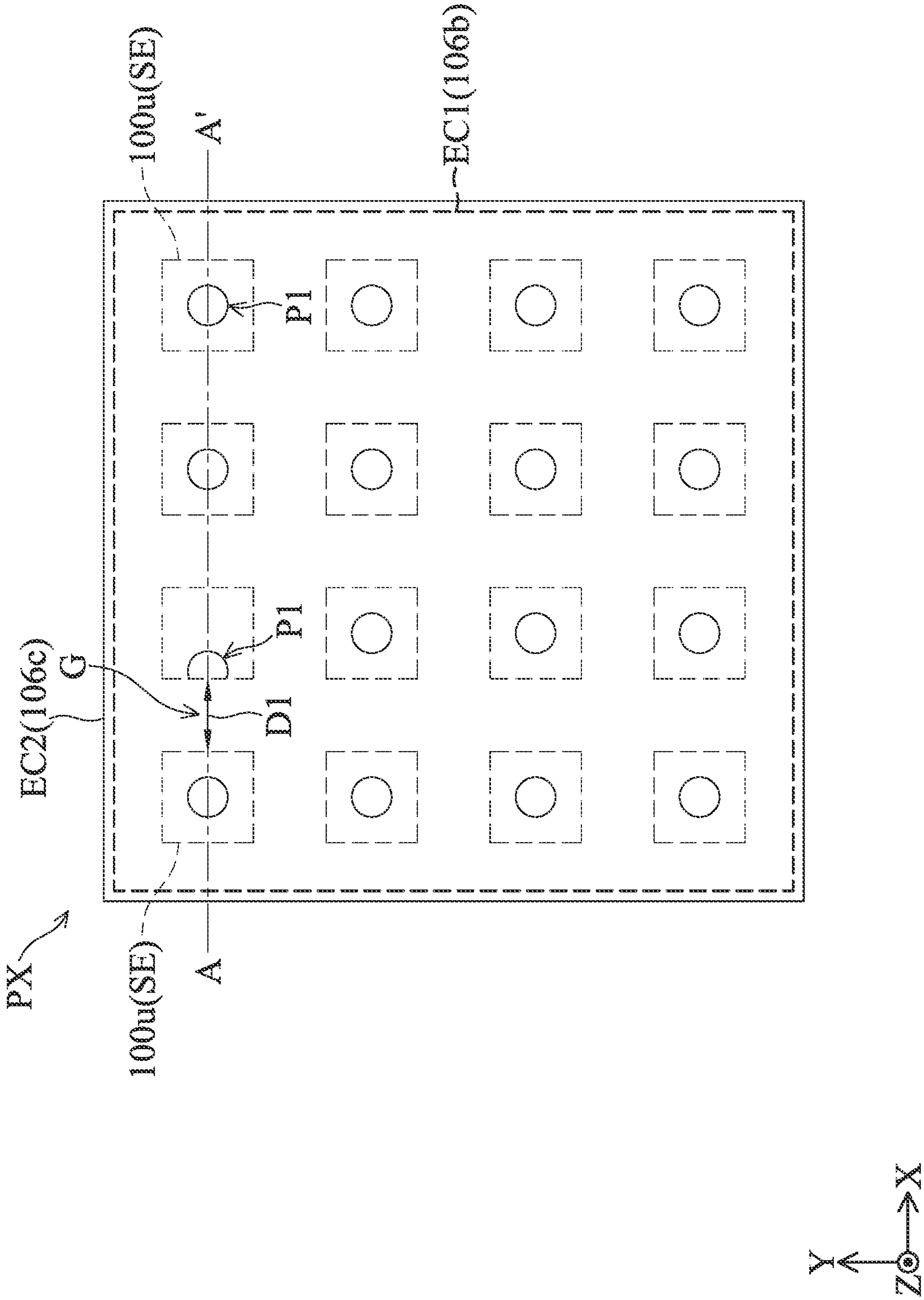
FIG. 1C is a top-view diagram of some elements of a sensing device in accordance with some embodiments of the present disclosure.

Refer to FIG. 1A and FIG. 1B. FIG. 1B is a top-view diagram of the first electrode EC1, the second electrode EC2 and the sensing units 100*u* of the sensing device 10A in accordance with some embodiments of the present disclosure. The cross-sectional structure formed by the section line A-A' in FIG. 1B corresponds to the cross-sectional diagram shown in FIG. 1A. In accordance with some embodiments, FIG. 1B substantially corresponds to an area of one pixel PX of the sensing device. As shown in FIG. 1A and FIG. 1B, the second electrode EC2 may be disposed on the sensing element SE and electrically connected to the sensing element SE. The second electrode EC2 includes the first aperture P1, and the first aperture P1 may overlap with the sensing element SE. Specifically, the first aperture P1 may overlap with the sensing element SE in the normal direction of the substrate 102 (e.g., the Z direction in the drawing). In accordance with some embodiments, the second electrode EC2 may include a plurality of first apertures P1, and the first apertures P1 may overlap with the respective sensing units 100*u* in the normal direction of the substrate 102 (e.g., the Z direction in the drawing). As shown in FIG. 1B, in accordance with some embodiments, the first aperture P1 may be enclosed. In other words, the first aperture P1 may be entirely located within the area of the sensing unit 100*u*. However, referring to FIG. 1C, in accordance with some other embodiments, the first aperture P1 may be non-enclosed. In other words, the first aperture P1 may be partially located within the area of the sensing unit 100*u*.

In accordance with some embodiments, the conductive layer 106*c* (the second electrode EC2) may include a metal material. For example, the metal material may include, but is not limited to, copper, silver, gold, tin, aluminum, molybdenum, tungsten, chromium, nickel, platinum, titanium, alloys of the foregoing metals, another suitable material, or a combination thereof. In accordance with some embodiments, the conductive layer 106*c* (the second electrode EC2) may be made of a metal material. Furthermore, the process of forming the conductive layer 106*c* may be the same as or similar to the process of forming the conductive layer 106*a* or the conductive layer 106*b*, and thus will not be repeated herein.

It should be noted that the second electrode EC2 is made of a metal material with light-shielding properties, and the second electrode EC2 has the first aperture P1 that is overlapping the sensing element SE; therefore, in addition to the conductive function, the second electrode EC2 also has the function of collimating light and can be used as a pinhole. By disposing the first aperture P1 of the second electrode EC2, parts of the structures of the sensing element SE and the optical element can be integrated, thereby reducing the number of photomasks used in the process, simplifying the process or improving the yield.

In accordance with some embodiments, the width of the first aperture P1 may be in a range from 1 micrometer (μm) to 5 micrometers (μm) (i.e. 1 μm≤the width of the first aperture P1≤5 μm), for example, 2 μm, 3 μm or 4 μm, but it is not limited thereto. In accordance with the embodiments of the present disclosure, the width of the first aperture P1 refers to the maximum width of the bottommost portion of the first aperture P1 in a direction perpendicular to the normal direction of the substrate 102 (e.g., the X direction in the drawing).

Referring to FIG. 1A, a passivation layer 104*c* then may be formed on the conductive layer 106*c* (the second electrode EC2). Specifically, the passivation layer 104*c* may be conformally formed on the conductive layer 106*c* and in the first aperture P1.

In accordance with some embodiments, the material of the passivation layer 104*c* may be the same as or similar to the material of the aforementioned passivation layer 104*a* or the passivation layer 104*b*, and the process of forming the passivation layer 104*c* may be the same as or similar to the process of forming the aforementioned passivation layer 104*a* or the passivation layer 104*b*, and thus will not be repeated herein.

Next, a dielectric layer 110*a* may be formed on the passivation layer 104*c*. The dielectric layer 110*a* may be filled into the first aperture P1. Then, a light-shielding layer 112*a*, a dielectric layer 110*b*, and a light-shielding layer 112*b* may be sequentially formed on the dielectric layer 110*a*, and a passivation layer 104*d* may be formed on the dielectric layer 110*b* and the light-shielding layer 112. In addition, a microlens 130 may be formed on the passivation layer 104*d*.

The light-shielding layer 112*a* and the light-shielding layer 112*b* can reduce the reflectivity of light. For example, the light-shielding layer 112*a* and the light-shielding layer 112*b* may absorb the light reflected by the conductive layer 106*b* (the second electrode EC2) or the light reflected back and forth between the conductive layers to achieve the effect of anti-reflection or reducing optical noise. The light-shielding layer 112*a* and the light-shielding layer 112*b* may also shield light with a large incidence angle, so as to achieve the effect of reducing the signal-to-noise ratio (SNR). As shown in FIG. 1A, the light-shielding layer 112*a* may be disposed on the second electrode EC2. The light-shielding layer 112*a* may include a second aperture P2, and the second aperture P2 may overlap with the first aperture P1. Specifically, the second aperture P2 of the light-shielding layer 112*a* may overlap with the first aperture P1 of the second electrode EC2 in the normal direction of the substrate 102 (e.g., the Z direction in the drawing). In accordance with some embodiments, the light-shielding layer 112*a* may include a plurality of second apertures P2, and the second apertures P2 may overlap with the respective first apertures P1.

Moreover, the width of the second aperture P2 may be greater than the width of the first aperture P1. In accordance with some embodiments, the width of the second aperture P2 may be in a range from 5 micrometers (μm) to 15 micrometers (μm) (i.e. 5 μm≤the width of the second aperture P2≤15 μm), for example, 8 μm, 10 μm, 12 μm or 14 μm, but it is not limited thereto. The definition of the width of the second aperture P2 is the same as the definition of the width of the first aperture P1, and thus will not be repeated herein.

As described above, the dielectric layer 110*b* may be formed above the dielectric layer 110*a* and filled into the second aperture P2, and the light-shielding layer 112*b* may be formed above the dielectric layer 110*b*. In addition, in accordance with some embodiments, the light-shielding layer 112*b* may include a third aperture P3, and the third aperture P3 may overlap with the second aperture P2. Specifically, the third aperture P3 of the light-shielding layer 112*b* may overlap with the second aperture P2 of the light-shielding layer 112*a* in the normal direction of the substrate 102 (e.g., the Z direction in the drawing). In accordance with some embodiments, the light-shielding layer 112*b* may include a plurality of third apertures P3, and the third apertures P3 may overlap with the respective second apertures P2.

Moreover, the width of the third aperture P3 may be greater than the width of the second aperture P2. In accordance with some embodiments, the width of the third aperture P3 may be in a range from 10 micrometers (μm) to 20 micrometers (μm) (i.e. 10 μm≤the width of the third aperture P3≤20 μm), for example, 12 μm, 14 μm, 16μ or 18 μm, but it is not limited thereto. The definition of the width of the third aperture P3 is the same as the definition of the width of the first aperture P1, and thus will not be repeated herein.

In addition, the arrangement of the microlens 130 may be helpful for concentrating the light in a specific area. For example, the light may be concentrated to the sensing unit 100*u* of the sensing element SE. As shown in FIG. 1A, the microlens 130 may be disposed on the second electrode EC2 and may overlap with the first aperture P1, the second aperture P2 and the third aperture P3 in the normal direction of the substrate 102 (e.g., the Z direction in the drawing). In accordance with some embodiments, the use of the microlens 130 in conjunction with the first aperture P1, the second aperture P2 and the third aperture P3 having the function of collimating light also facilitates the miniaturization of the sensing element SE. For example, the position irradiated by the light collected from the microlens 130 is provided with the sensing unit 100*u*, and the position not irradiated by the light collected from the microlens 130 is provided with the planarization layer 108*b*. In this way, the effect of stray capacitance on the photocurrent of the sensing element SE can be reduced. Therefore, the sensitivity of the sensing element SE can be improved or the overall performance of the sensing device 10A can be improved.

In accordance with some embodiments, the materials of the dielectric layer 110*a* and the dielectric layer 110*b* may include an organic insulating material or an inorganic insulating material. For example, the organic insulating material may include perfluoroalkoxy alkane (PFA), polytetrafluoroethylene (PTFE), fluorinated ethylene propylene (FEP), polyethylene, another suitable material or a combination thereof, but it is not limited thereto. For example, the inorganic insulating material may include silicon oxide, silicon nitride, silicon oxynitride, another high-k dielectric material, or a combination thereof, but it is not limited thereto.

In accordance with some embodiments, the dielectric layer 110*a* and the dielectric layer 110*b* may be formed by a coating process, a chemical vapor deposition process, a physical vapor deposition process, a printing process, an evaporation process, a sputtering process, another suitable process, or a combination thereof.

In accordance with some embodiments, the light-shielding layer 112*a* and the light-shielding layer 112*b* may include an organic material or a metal material. The organic material may include black resins, but it is not limited thereto. The metal material may include copper, aluminum, molybdenum, indium, ruthenium, tin, gold, platinum, zinc, silver, titanium, lead, nickel, chromium, magnesium, palladium, alloys of the foregoing metals, another suitable metal material, or a combination thereof, but it is not limited thereto. In accordance with some embodiments, the material of the light-shielding layer 112*a* and/or the light-shielding layer 112*b* may be the same as the material of the second electrode EC2.

In accordance with some embodiments, the light-shielding layer 112*a* and the light-shielding layer 112*b* may be formed by a chemical vapor deposition process, a physical vapor deposition process, an electroplating process, an electroless plating process, another suitable process, or a combination thereof. In addition, the light-shielding layer 112*a* and the light-shielding layer 112*b* may be patterned by a photolithography process and/or an etching process to respectively form a second aperture P2 and a third aperture P3.

In accordance with some embodiments, the microlens 130 may be another structure having a light-collecting effect. In accordance with some embodiments, the material of the microlens 130 may include silicon oxide, polymethylmethacrylate (PMMA), cycloolefin polymer (COP), polycarbonate (PC), another suitable material or a combination thereof, but it is not limited thereto.

In addition, in accordance with some embodiments, the microlens 130 may be formed by a chemical vapor deposition process, a physical vapor deposition process, a coating process, a printing process, another suitable process, or a combination thereof. Moreover, the microlens 130 may be patterned by a photolithography process and/or an etching process to have a suitable shape and profile.

As shown in FIG. 1A, the formed sensing device 10A may include a substrate 102, a first electrode EC1, a sensing element SE, and a second electrode EC2. The first electrode EC1 may be disposed on the substrate 102. The sensing element SE may be disposed on the first electrode EC1 and electrically connected to the first electrode EC1. In addition, the second electrode EC2 may be disposed on the sensing element SE and electrically connected to the sensing element SE. Moreover, the second electrode EC2 may include a first aperture P1, and the first aperture P1 may overlap with the sensing element SE. In accordance with some embodiments, the sensing element SE may include a plurality of sensing units 100*u* that are separate from each other. In accordance with some embodiments, the second electrode EC2 may include a plurality of first apertures P1, and the first apertures P1 may overlap with the respective sensing units 100*u*. In accordance with some embodiments, the second electrode EC2 may be made of a metal material. In accordance with some embodiments, the second electrode EC2 may be used to provide a common voltage. In accordance with some embodiments, the sensing device 10A may include a light-shielding layer 112*a* disposed on the second electrode EC2. The light-shielding layer 112*a* may include a second aperture P2, and the second aperture P2 may overlap with the first aperture P1. In accordance with some embodiments, the sensing device 10A may include a microlens 130 that is disposed on the second electrode EC2 and that overlaps with the first aperture P1.

Figure 2:
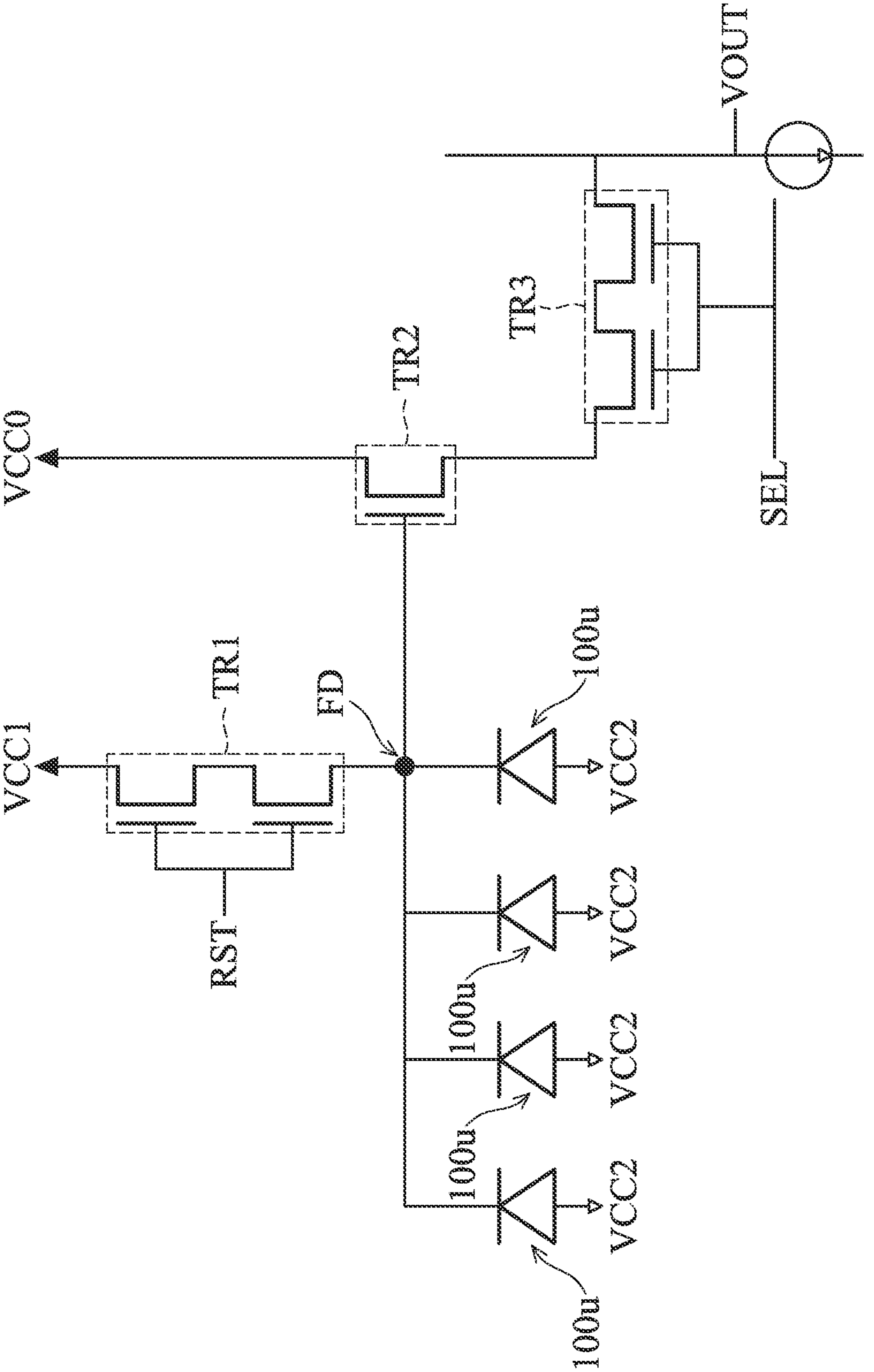
FIG. 2 is an equivalent circuit diagram of a sensing device in accordance with some embodiments of the present disclosure.

Next, refer to FIG. 2, which is an equivalent circuit diagram of the sensing device 10A in accordance with some embodiments of the present disclosure. As shown in FIG. 2, each of the sensing units 100*u* in the sensing element SE may be electrically connected to a terminal FD in the sensing circuit. In accordance with some embodiments, the plurality of sensing units 100*u* may be arranged discontinuously and electrically connected to each other in parallel. In accordance with some embodiments, the terminal FD may be a floating diffusion node, the plurality of sensing units 100*u* may generate a plurality of sensing signals according to the collected light, and transmit these sensing signals together to the terminal FD. Specifically, the sensing signals from the plurality of sensing units 100*u* may be integrated into a sensing signal before being transmitted to the terminal FD. In such a circuit arrangement, the equivalent capacitance of the sensing element SE may be reduced, and the sensitivity and performance of the sensing device may be improved. In addition, in accordance with the embodiments of the present disclosure, a pixel PX of the sensing device may be an area defined by the scan line signal SEL and the control signal RST described below.

Moreover, the thin-film transistor TR1 and the thin-film transistor TR2 may be electrically connected to the terminal FD, and the thin-film transistor TR2 may be further electrically connected to the thin-film transistor TR3. In accordance with some embodiments, the thin-film transistor TR1 may reset the potential of the terminal FD to give an initial potential, and the photocurrents generated by the sensing units 100*u* may change the potential of the terminal FD, and the signals generated by the photocurrents may be transmitted by the thin-film transistor TR2 and the thin-film transistor TR3. Furthermore, the plurality of sensing units 100*u* may be coupled to a system voltage line VCC2.

Specifically, the thin-film transistor TR1 may have a first terminal, a second terminal and a control terminal. The first terminal of the thin-film transistor TR1 may be coupled to a system voltage line VCC1. The second terminal of the thin-film transistor TR1 may be coupled to the terminal FD. The control terminal of the thin-film transistor TR1 may be coupled to a control signal RST. The thin-film transistor TR1 may connect to or disconnect the system voltage line VCC1 according to the control signal RST. When the thin-film transistor TR1 is electrically connected to the system voltage line VCC1, the potential of the terminal FD can be reset; on the contrary, when the thin-film transistor TR1 is disconnected from the system voltage line VCC1, the potential of the terminal FD is not reset.

Moreover, the thin-film transistor TR2 may have a first terminal, a second terminal and a control terminal. The first terminal of the thin-film transistor TR2 may be coupled to a system voltage line VCC0. The second terminal of the thin-film transistor TR2 may be coupled to the first terminal of the thin-film transistor TR3. The control terminal of the thin-film transistor TR2 may be coupled to the second terminal of the thin-film transistor TR1 and the terminal FD. The thin-film transistor TR2 may transmit the signal of the terminal FD to a readout signal line VOUT through the thin-film transistor TR3.

In addition, the thin-film transistor TR3 may also have a first terminal, a second terminal and a control terminal. The first terminal of the thin-film transistor TR3 may be coupled to the second terminal of the thin-film transistor TR2. The second terminal of the thin-film transistor TR3 may be coupled to the readout signal line VOUT. The control terminal of the thin-film transistor TR3 may be coupled to a scan line signal SEL. The thin-film transistor TR3 may connect or disconnect the first terminal of the thin-film transistor TR3 and the readout signal line VOUT according to the scan line signal SEL. When the first terminal of the thin-film transistor TR3 is electrically connected to the readout signal line VOUT, the amplified current LAMP is output to the readout signal line VOUT; on the contrary, when the first terminal of the thin-film transistor TR3 is disconnected from the readout signal line VOUT, the amplified current LAMP is not output to the readout signal line VOUT.

Figure 3A:
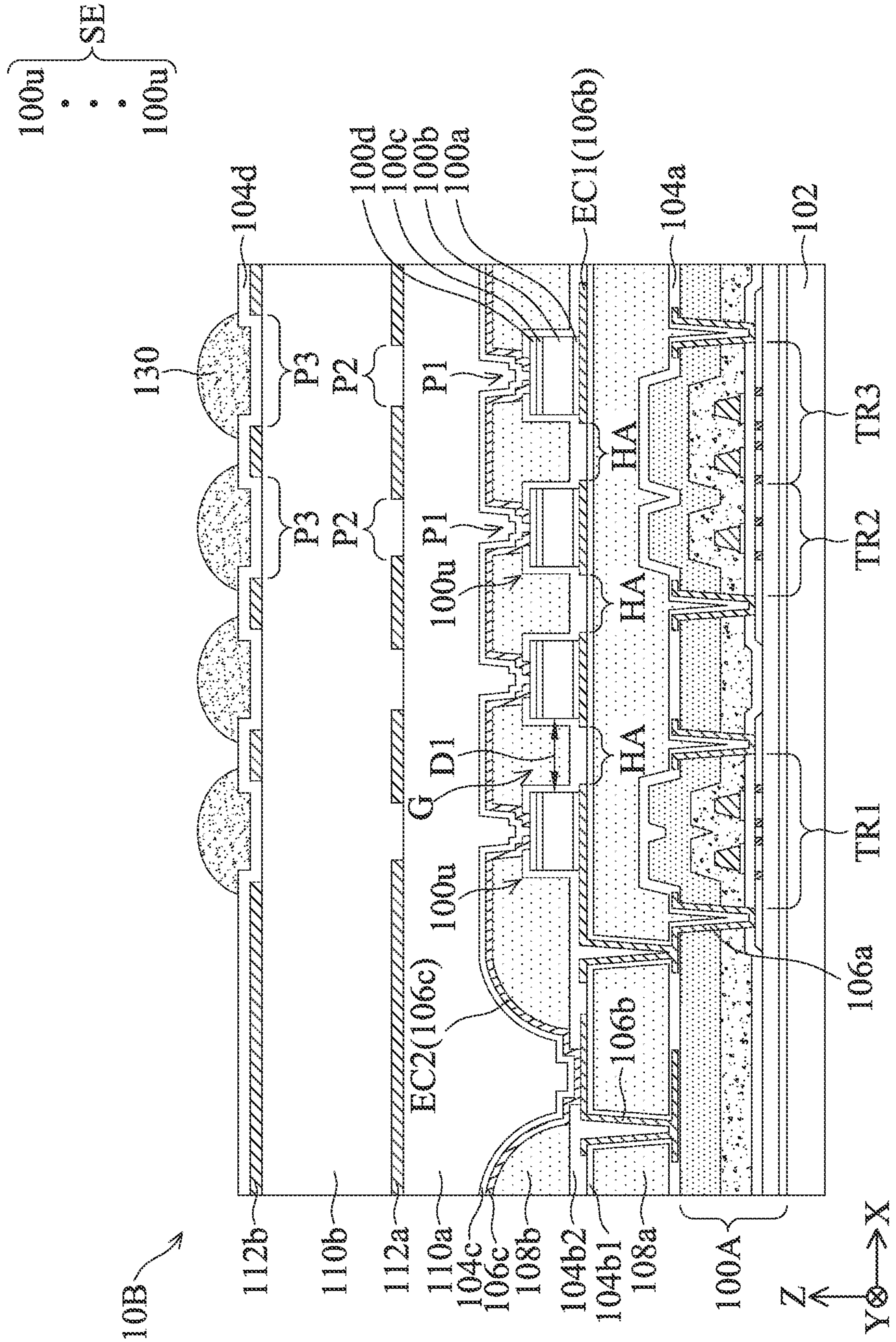
FIG. 3A is a cross-sectional diagram of a sensing device in accordance with some embodiments of the present disclosure.
Figure 3B:
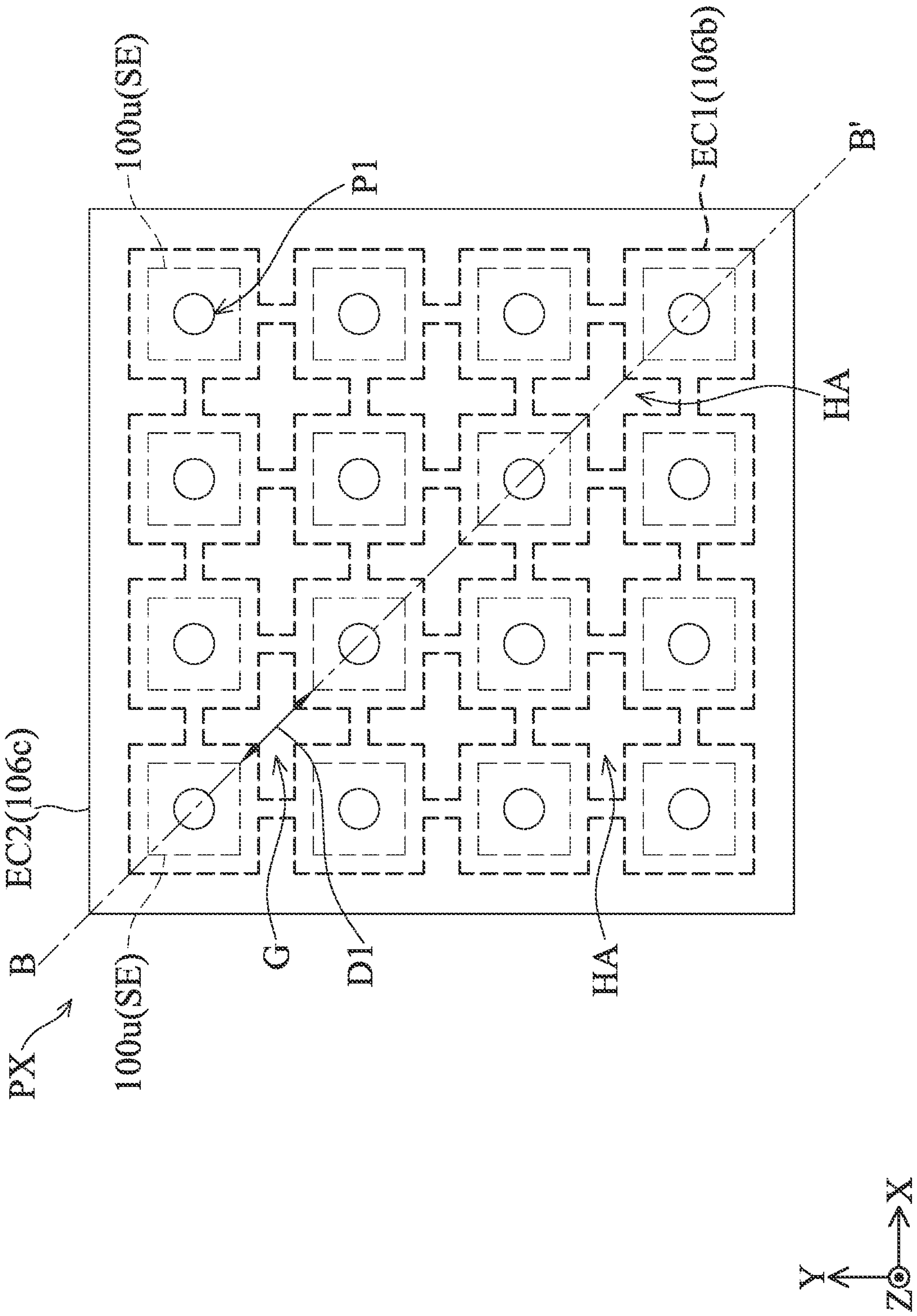
FIG. 3B is a top-view diagram of some elements of a sensing device in accordance with some embodiments of the present disclosure.

Next, refer to FIG. 3A and FIG. 3B. FIG. 3A is a cross-sectional diagram of a sensing device 10B in accordance with some other embodiments of the present disclosure. FIG. 3B is a top-view diagram of the first electrode EC1, the second electrode EC2 and the sensing units 100*u* of the sensing device 10B in accordance with some embodiments of the present disclosure. In addition, the cross-sectional structure formed by the section line B-B' in FIG. 3B corresponds to the cross-sectional diagram shown in FIG. 3A. Moreover, it should be understood that the same or similar components or elements in the following paragraphs will be denoted by the same or similar reference numbers, and their materials, manufacturing methods and functions are the same or similar to those described above, and thus they will not be repeated in the following paragraphs.

The sensing device 10B shown in FIG. 3A is substantially similar to the sensing device 10A. The difference between them includes that, in the sensing device 10B, the first electrode EC1 may further include a hollow area HA, and the gap G between the plurality of sensing units 100*u* may at least partially overlap with the hollow area HA in the normal direction of the substrate 102. Specifically, the hollow area HA may at least partially overlap with the gap G between the plurality of sensing units 100*u* in the normal direction of the substrate 102 (e.g., the Z direction in the drawing). In accordance with some embodiments, the hollow area HA may overlap with the portion of the planarization layer 108*b* that is disposed between the sensing units 100*u* in the normal direction of the substrate 102.

As shown in FIG. 3B, in accordance with some embodiments, the first electrode EC1 may include a plurality of hollow areas HA, and portions of the first electrode EC1 that overlap with different sensing units 100*u* may be connected to each other. In accordance with some embodiments, the hollow area HA of the first electrode EC1 may have a shape that is similar to a cruciform or a cross, but it is not limited thereto. It should be noted that that the arrangement of the hollow areas HA can further reduce the overlapping area between the first electrode EC1 and the second electrode EC2, and therefore the stray capacitance can be reduced.

In accordance with some embodiments, the portion of the conductive layer 106*b* overlapping with the gap G between the sensing units 100*u* may be removed by one or more photolithography processes and/or etching processes to form a hollow area HA.

As shown in FIG. 3A, the sensing device 10B may include a substrate 102, a first electrode EC1, a sensing element SE, and a second electrode EC2. The first electrode EC1 may be disposed on the substrate 102. The sensing element SE may be disposed on the first electrode EC1 and electrically connected to the first electrode EC1. The sensing element SE may include a plurality of sensing units 100*u* that are separate from each other. In addition, the second electrode EC2 may be disposed on the sensing element SE and electrically connected to the plurality of sensing units 100*u*. Moreover, the first electrode EC1 may have the hollow area HA, and the hollow area HA may overlap with the gap G between the plurality of sensing units 100*u*. In accordance with some embodiments, the second electrode EC2 may be made of a metal material. In accordance with some embodiments, the second electrode EC2 may include a plurality of first apertures P1, and the first apertures P1 may overlap with the respective sensing units 100*u*. In accordance with some embodiments, the second electrode EC2 may be used to provide a common voltage. In accordance with some embodiments, the sensing device may include a light-shielding layer 112*a*, and the light-shielding layer 112*a* may be disposed on the second electrode EC2. The light-shielding layer 112*a* may include a plurality of second apertures P2, and the plurality of second apertures P2 may respectively overlap with the plurality of sensing units 100*u*. In accordance with some embodiments, the sensing device 10B may include a microlens 130 that is disposed on the second electrode EC2 and that overlaps with the plurality of sensing units 100*u*.

Figure 4A:
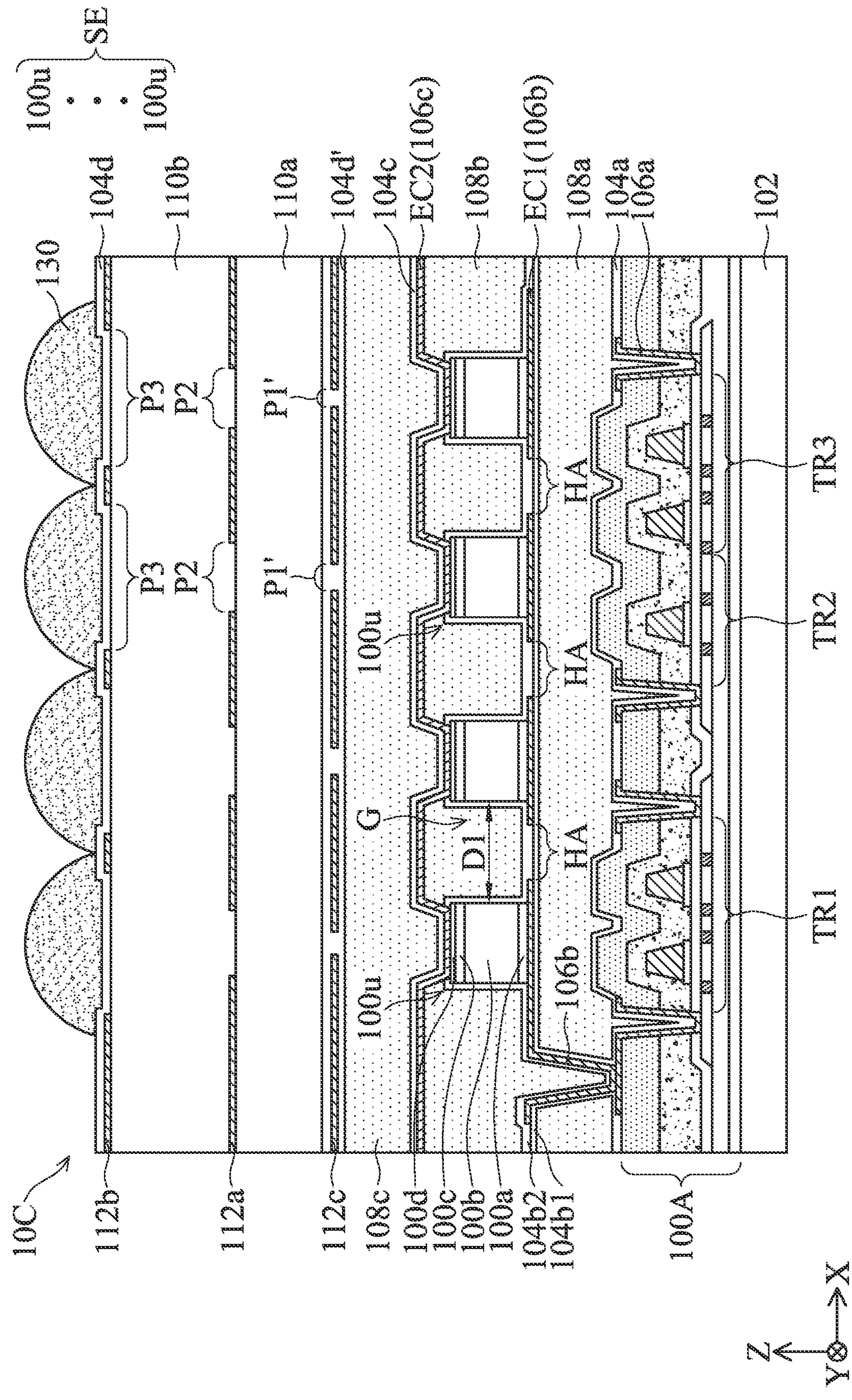
FIG. 4A is a cross-sectional diagram of a sensing device in accordance with some embodiments of the present disclosure.
Figure 4B:
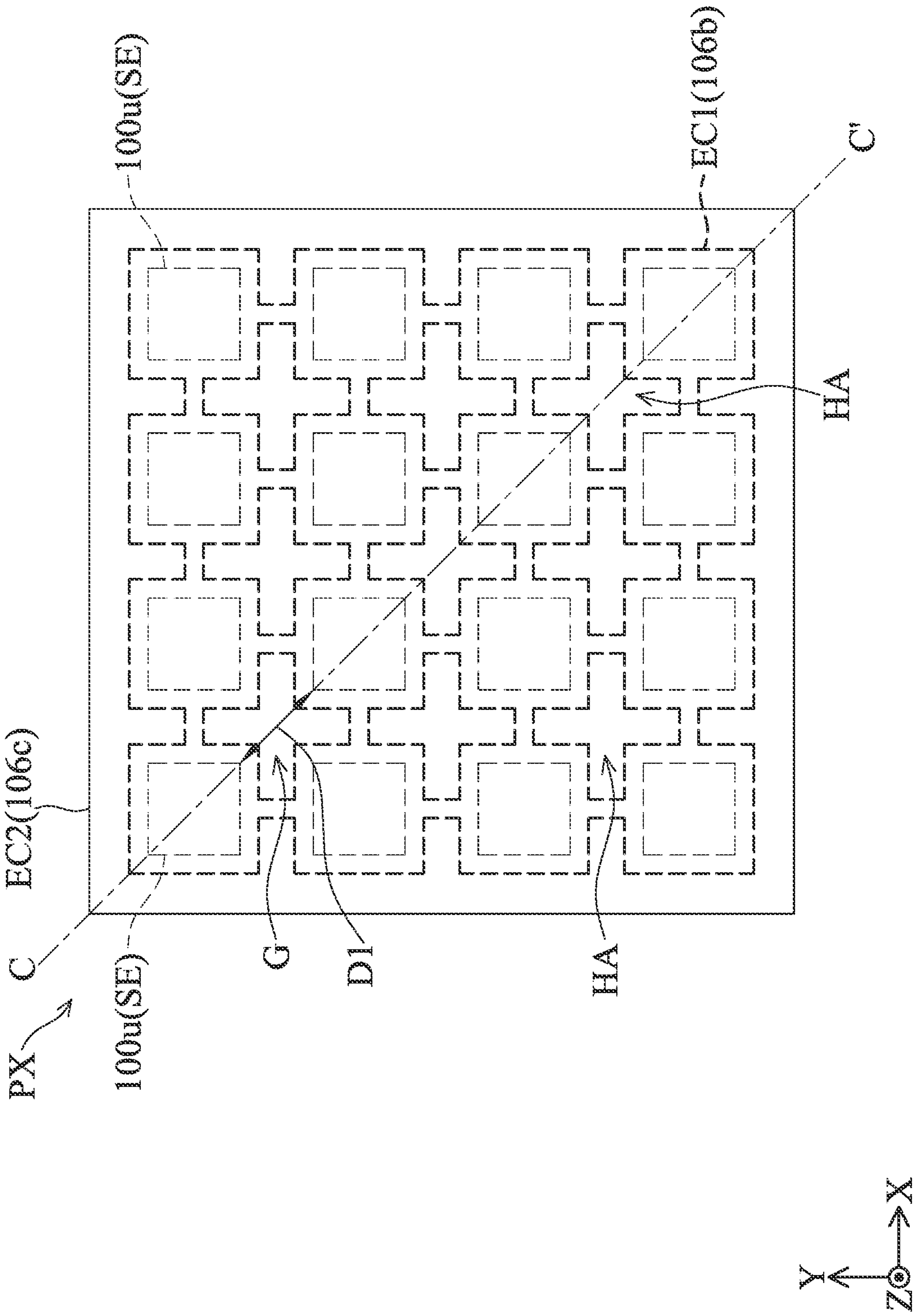
FIG. 4B is a top-view diagram of some elements of a sensing device in accordance with some embodiments of the present disclosure.

Next, refer to FIG. 4A and FIG. 4B. FIG. 4A is a cross-sectional diagram of a sensing device 10C in accordance with some other embodiments of the present disclosure. FIG. 4B is a top-view diagram of the first electrode EC1, the second electrode EC2, and the sensing units 100*u* of the sensing device 10C in accordance with some embodiments of the present disclosure. In addition, the cross-sectional structure formed by the section line C-C' in FIG. 4B corresponds to the cross-sectional diagram shown in FIG. 4A.

The sensing device 10C shown in FIG. 4A is substantially similar to the sensing device 10A. However, as shown in FIG. 4A, in accordance with some embodiments, the sensing device 10C may further include a planarization layer 108*c*, a passivation layer 104*d'* and a light-shielding layer 112*c*. The planarization layer 108*c*, the passivation layer 104*d'* or/and the light-shielding layer 112*c* may be disposed between the passivation layer 104*c* and the dielectric layer 110*a*. The light-shielding layer 112*c* may have a first aperture P1', and the conductive layer 106*c* may not have the first aperture P1. Furthermore, the first aperture P1' of the light-shielding layer 112*c* may overlap with the sensing unit 100*u* of the sensing element SE in the normal direction of the substrate 102. In addition, the first aperture P1' of the light-shielding layer 112*c* may overlap with the second aperture P2 of the light-shielding layer 112*a* and the third aperture P3 of the light-shielding layer 112*b* in the normal direction of the substrate 102.

Moreover, the width of the first aperture P1' may be smaller than the widths of the second aperture P2 and the third aperture P3. In accordance with some embodiments, the width of the first aperture P1' may be in a range from 1 micrometer (μm) to 5 micrometers (μm) (i.e. 1 μm≤the width of the first aperture P1'≤5 μm), for example, 2 μm, 3 μm or 4 μm. The definition of the width of the first aperture P1' is the same as the definition of the width of the first aperture P1, and thus will not be repeated herein.

In accordance with some embodiments, the materials of the planarization layer 108*c*, the passivation layer 104*d'*, and the light-shielding layer 112*c* may be the same as or similar to those of the aforementioned planarization layer 108*a*, the passivation layer 104*a*, and the light-shielding layer 112*a*, and thus will not be repeated herein. In addition, the processes of forming the planarization layer 108*c*, the passivation layer 104*d'*, the light-shielding layer 112*c* and the first aperture P1' may be the same as or similar to the processes of forming the aforementioned planarization layer 108*a*, the passivation layer 104*a*, the light-shielding layer 112*a* and the first aperture P1, and thus will not be repeated herein. Moreover, in this embodiment, the material of the conductive layer 106*c* (the second electrode EC2) includes a transparent conductive material, and the transparent conductive material may include a transparent conductive oxide (TCO), such as indium tin oxide (ITO), antimony zinc oxide (AZO), tin oxide (SnO), zinc oxide (ZnO), indium zinc oxide (IZO), indium gallium zinc oxide (IGZO), indium tin zinc oxide (ITZO), antimony tin oxide (ATO), another suitable transparent conductive material, or a combination thereof, but it is not limited thereto.

In addition, as shown in FIG. 4A and FIG. 4B, in this embodiment, the first electrode EC1 may have the hollow area HA, and the gap G between the plurality of sensing units 100*u* may at least partially overlap with the hollow area HA in the normal direction of the substrate 102. In addition, the second electrode EC2 may not have the first aperture P1. In accordance with some embodiments, the hollow area HA may overlap with the portion of the planarization layer 108*b* that is disposed between the sensing units 100*u* in the normal direction of the substrate 102. In accordance with some embodiments, portions of the first electrodes EC1 that overlap with different sensing units 100*u* may be connected to each other. In accordance with some embodiments, the hollow area HA of the first electrode EC1 may have a shape similar to a cruciform or a cross, but it is not limited thereto. It should be noted that that the arrangement of the hollow areas HA can further reduce the overlapping area between the first electrode EC1 and the second electrode EC2, and therefore the stray capacitance can be reduced.

Figure 5A:
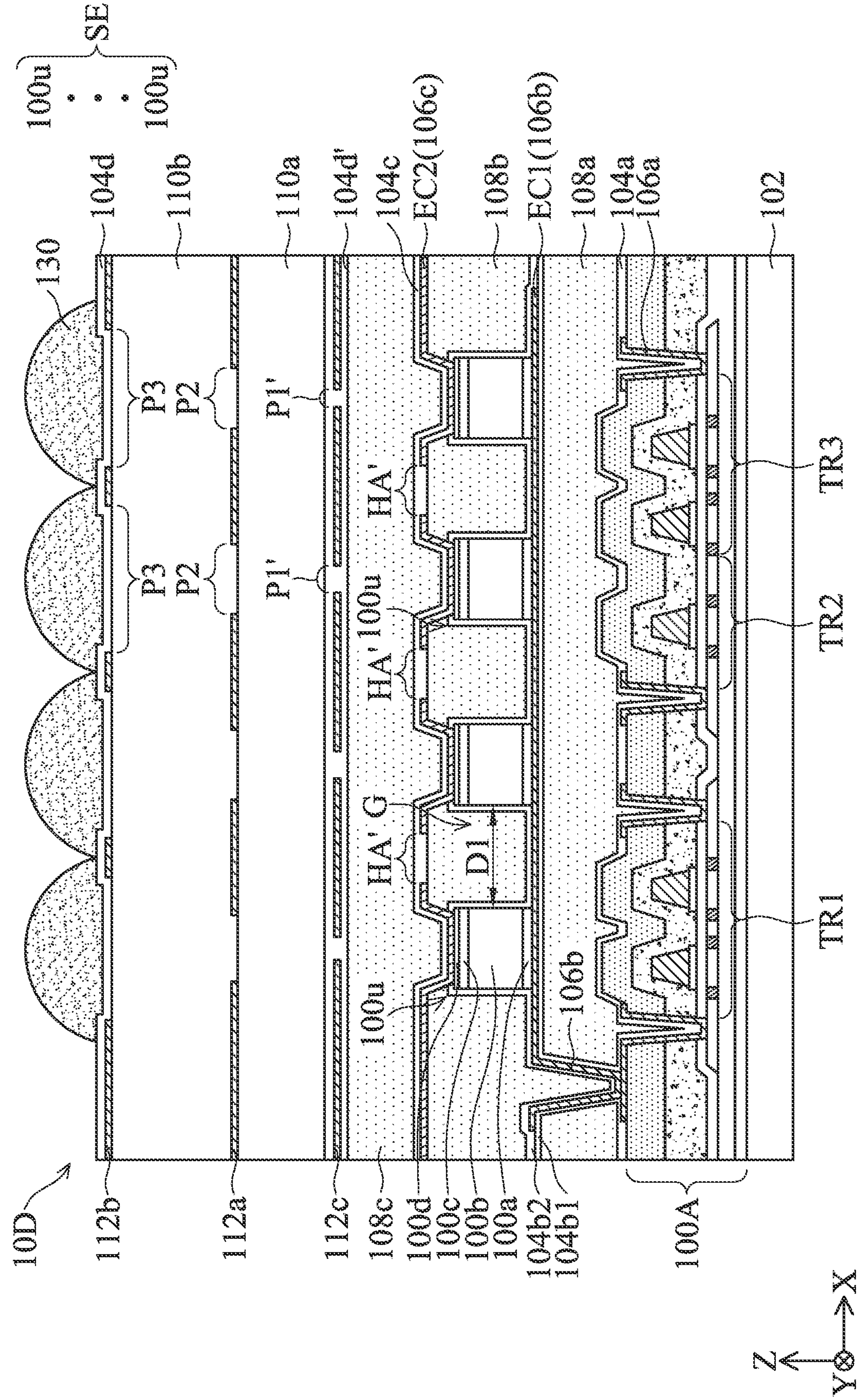
FIG. 5A is a cross-sectional diagram of a sensing device in accordance with some embodiments of the present disclosure.
Figure 5B:
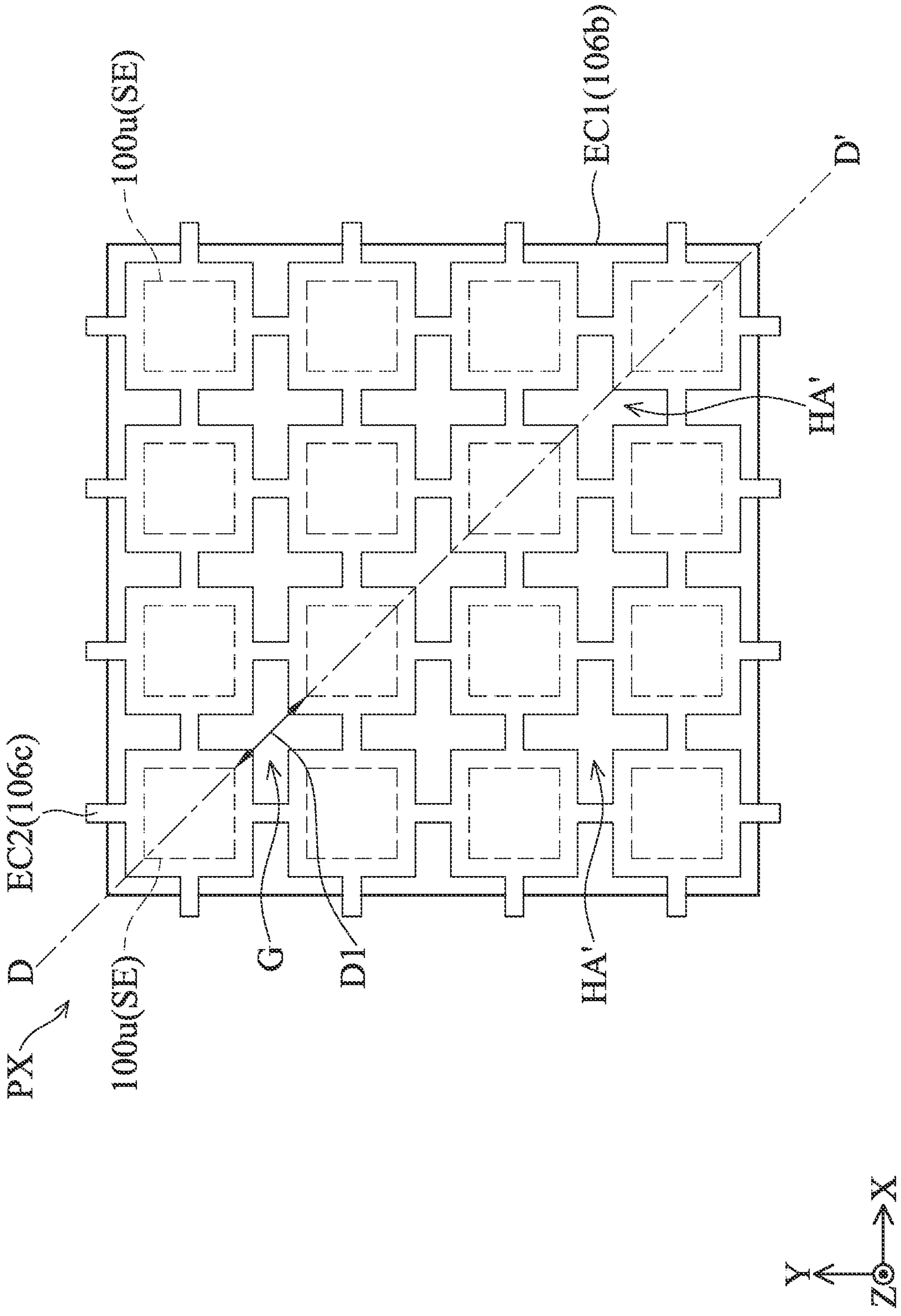
FIG. 5B is a top-view diagram of some elements of a sensing device in accordance with some embodiments of the present disclosure.

Next, refer to FIG. 5A and FIG. 5B. FIG. 5A is a cross-sectional diagram of a sensing device 10D in accordance with some other embodiments of the present disclosure. FIG. 5B is a top-view diagram of the first electrode EC1, the second electrode EC2, and the sensing units 100*u* of the sensing device 10D in accordance with some embodiments of the present disclosure. In addition, the cross-sectional structure formed by the section line D-D' in FIG. 5B corresponds to the cross-sectional diagram shown in FIG. 5A.

The sensing device 10D shown in FIG. 5A is substantially similar to the sensing device 10C. However, as shown in FIG. 5A, in the sensing device 10D, the first electrode EC1 may not have a hollow area HA, and the second electrode EC2 may include a hollow area HA'. In addition, the gap G between the plurality of sensing units 100*u* may at least partially overlap with the hollow area HA' in the normal direction of the substrate 102. In accordance with some embodiments, the hollow area HA' may overlap with the portion of the planarization layer 108*b* that is disposed between the sensing units 100*u* in the normal direction of the substrate 102.

As shown in FIG. 5B, in accordance with some embodiments, the second electrode EC2 may include a plurality of hollow areas HA', and portions of the second electrode EC2 that overlap with different sensing units 100*u* may be connected to each other. In accordance with some embodiments, the hollow area HA' of the second electrode EC2 may have a shape similar to a cruciform or a cross, but it is not limited thereto. It should be noted that that the arrangement of the hollow areas HA' can further reduce the overlapping area between the first electrode EC1 and the second electrode EC2, and therefore the stray capacitance can be reduced.

Moreover, in this embodiment, the material of the conductive layer 106*c* (the second electrode EC2) includes the transparent conductive material as described above. In accordance with some embodiments, a portion of the conductive layer 106*c* overlapping with the gap G between the sensing units 100*u* may be removed by one or more photolithography processes and/or etching processes to form a hollow area HA'.

Figure 6A:
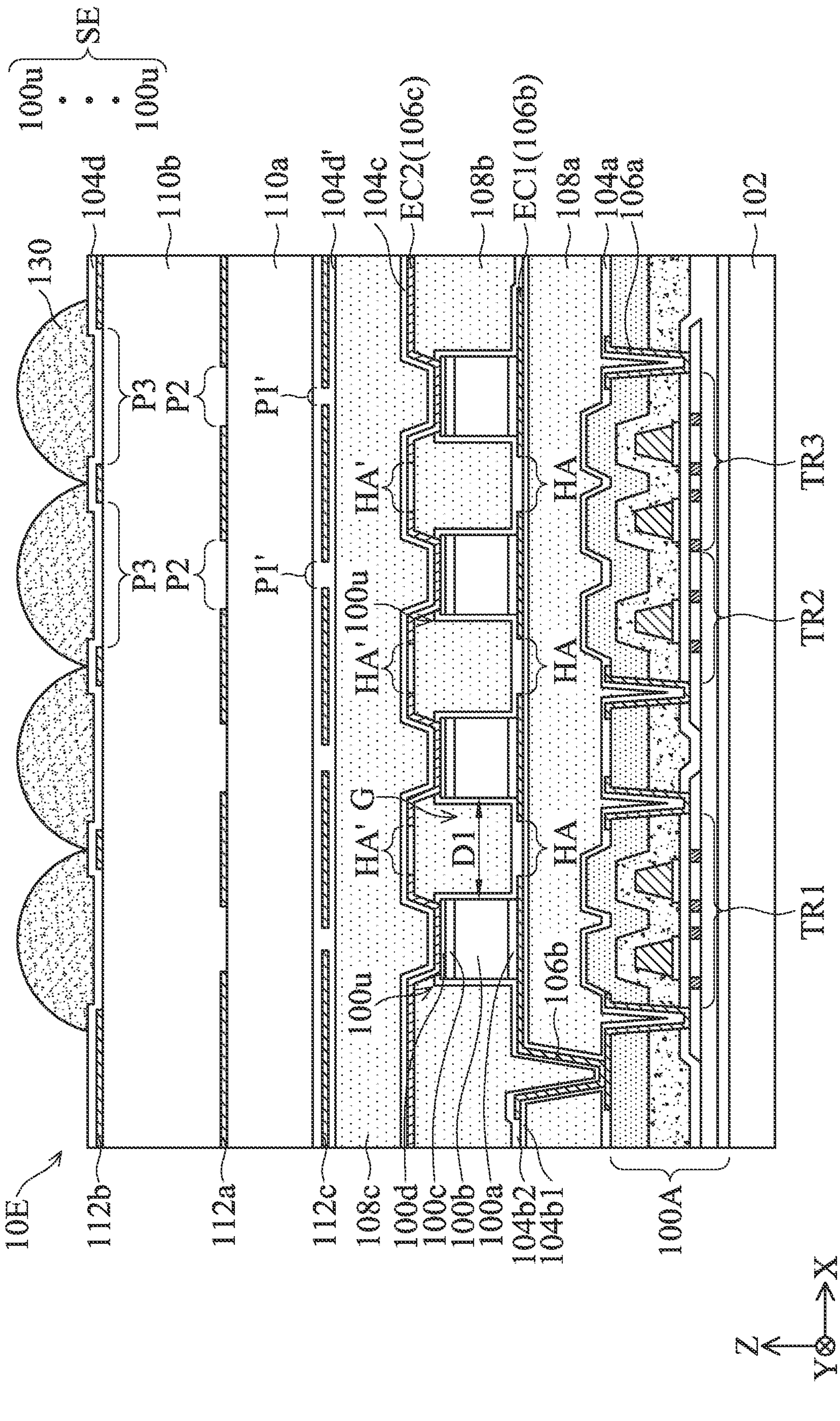
FIG. 6A is a cross-sectional diagram of a sensing device in accordance with some embodiments of the present disclosure.
Figure 6B:
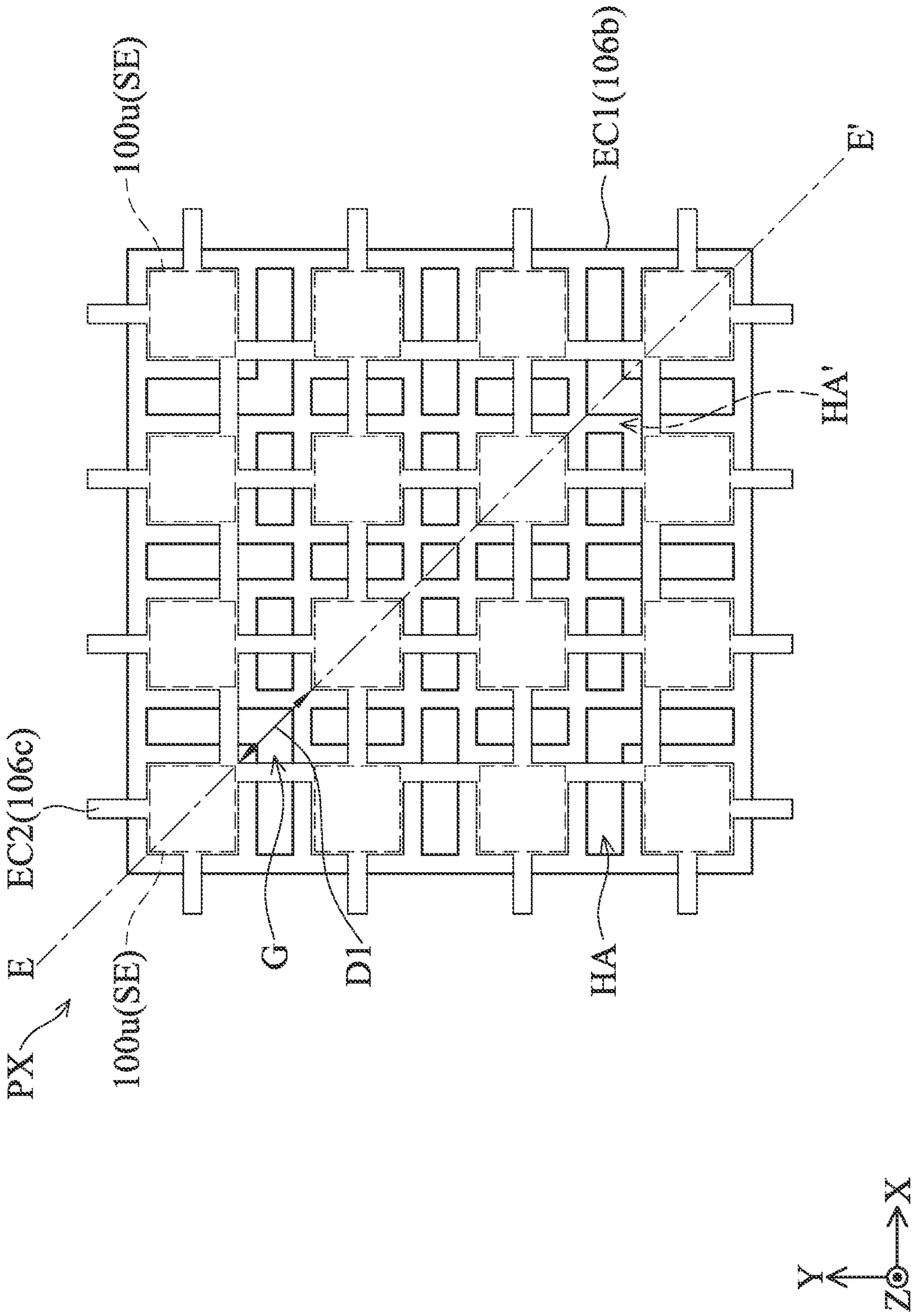
FIG. 6B is a top-view diagram of some elements of a sensing device in accordance with some embodiments of the present disclosure.

Next, refer to FIG. 6A and FIG. 6B. FIG. 6A is a cross-sectional diagram of a sensing device 10E in accordance with some other embodiments of the present disclosure. FIG. 6B is a top-view diagram of the first electrode EC1, the second electrode EC2, and the sensing units 100*u* of the sensing device 10E in accordance with some embodiments of the present disclosure. In addition, the cross-sectional structure formed by the section line E-E' in FIG. 6B corresponds to the cross-sectional diagram shown in FIG. 6A.

The sensing device 10E shown in FIG. 6A is substantially similar to the sensing device 10C. However, as shown in FIG. 6A, in the sensing device 10E, the first electrode EC1 may include a hollow area HA, and the second electrode EC2 may also include a hollow area HA'. In addition, the gap G between the plurality of sensing units 100*u* may at least partially overlap with the hollow area HA and the hollow area HA' in the normal direction of the substrate 102. In accordance with some embodiments, the hollow area HA and the hollow area HA' may overlap with the portion of the planarization layer 108*b* that is disposed between the sensing units 100*u* in the normal direction of the substrate 102.

As shown in FIG. 6B, in accordance with some embodiments, the first electrode EC1 may include a plurality of hollow areas HA, and the second electrode EC2 may include a plurality of hollow areas HA'. The portions of the first electrode EC1 that overlap with different sensing units 100*u* may be connected to each other, and the portions of the second electrode EC2 that overlap with different sensing units 100*u* may be connected to each other. In accordance with some embodiments, in the normal direction of the substrate 102, the hollow area HA' of the second electrode EC2 may partially overlap with the hollow area HA of the first electrode EC1. Furthermore, the shape of the hollow area HA of the first electrode EC1 may be different from the shape of the hollow area HA' of the second electrode EC2. In accordance with some embodiments, the hollow area HA of the first electrode EC1 may have a shape similar to a rectangle or an L shape, but it is not limited thereto. In accordance with some embodiments, the hollow area HA' of the second electrode EC2 may have a shape similar to a rectangle or a rectangle with a recess, but it is not limited thereto. It should be noted that the arrangement of the hollow areas HA and the hollow areas HA' can further reduce the overlapping area between the first electrode EC1 and the second electrode EC2, and therefore the stray capacitance can be reduced.

Figure 7:
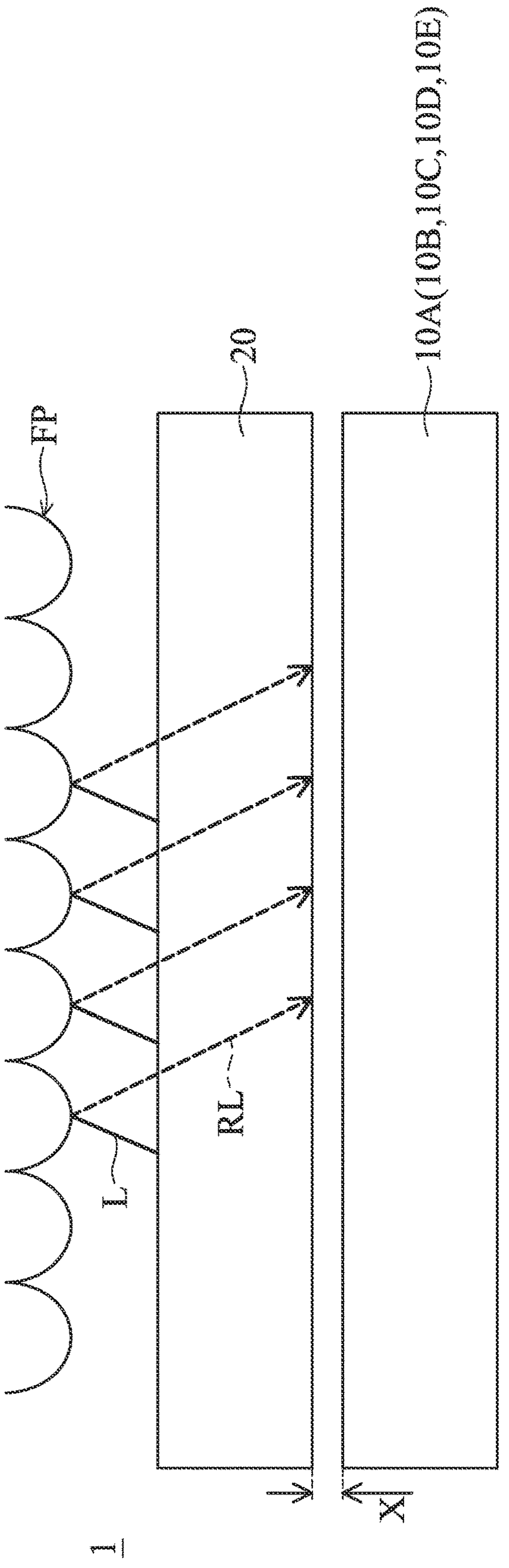
FIG. 7 is a schematic diagram of an electronic device in accordance with some embodiments of the present disclosure.

In addition, an electronic device including the aforementioned sensing device is also provided in the present disclosure. Refer to FIG. 7, which is a schematic diagram of an electronic device 1 in accordance with some embodiments of the present disclosure. It should be understood that, for clear description, the drawings only schematically illustrate some elements of the electronic device 1. In accordance with some embodiments, additional features may be added to the electronic device 1 described below.

In accordance with some embodiments, the electronic device 1 may include a display device, an antenna device, a sensing device, a tiled device, a touch display device, a curved display device, or a free shape display device, but it is not limited thereto. The electronic device may be a bendable or flexible electronic device. The electronic device may include light-emitting diodes, fluorescence, phosphors, another suitable display medium, or a combination thereof, but it is not limited thereto. The light-emitting diode may include, for example, an organic light-emitting diode (OLED), a mini light-emitting diode (mini LED), a micro light-emitting diode (micro LED) or a quantum dot light-emitting diode (such as QLED, QDLED), or another suitable material or any combination of the above, but it is not limited thereto. The display device may include, for example, a tiled display device, but it is not limited thereto. The sensing device may include, but is not limited to, a fingerprint sensing device, a visible-light sensing device, an infrared-light sensing device, or an X-ray sensing device. It should be noted that the electronic device can be any arrangement and combination of the foregoing, but it is not limited thereto. In addition, the shape of the electronic device may be rectangular, circular, polygonal, a shape with curved edges, or another suitable shape. The electronic device may have peripheral systems such as a driving system, a control system, a light source system, a shelf system, etc. to support a display device, or a tiled device. In accordance with some embodiments, the electronic device may be an X-ray sensor (not illustrated), and the electronic device may include a scintillation layer (not illustrated) and a sensing device, but it is not limited thereto.

Taking the embodiment of the present disclosure as an example, the electronic device 1 may include the aforementioned sensing device 10A (or the sensing device 10B, the sensing device 10C, the sensing device 10D or the sensing device 10E) and a display device 20. The sensing device 10A may be disposed below the display device 20. In accordance with some embodiments, the electronic device 1 may have functions such as touch-sensing or fingerprint recognition. For example, the electronic device 1 may be a touch display device, but it is not limited thereto. For example, the light L generated by the display device 20 may be reflected by a finger FP to generate the reflected light RL, and the reflected light RL may be transmitted to the sensing device 10A. The sensing device 10A can sense the touch of the finger, and convert it into an electronic signal to the corresponding driving component or signal processing component for identification and analysis. In accordance with some embodiments, the sensing device 10A may be fixed below the display device 20 by an adhesive layer (not illustrated). In accordance with some embodiments, the sensing device 10A may be disposed below the display device 20, and an air layer may exist between the sensing device 10A and the display device 20 (referring to FIG. 7). There may be a distance X between the sensing device 10A and the display device 20. In accordance with some embodiments, the distance X may be in a range from 0.05 millimeters (mm) to 0.15 millimeters (mm) (i.e. 0.05 mm≤the distance X≤0.15 mm), for example, 0.1 mm. In accordance with some embodiments, the adhesive layer may include a light-curable adhesive material, a heat-curable adhesive material, a light-heat-curable adhesive material, another suitable material, or a combination thereof, but it is not limited thereto. For example, in accordance with some embodiments, the adhesive layer may include, but is not limited to, optical clear adhesive (OCA), optical clear resin (OCR), pressure sensitive adhesive (PSA), another suitable material, or a combination thereof.

In accordance with some embodiments, the display device 20 may include, for example, a liquid-crystal display panel, a light-emitting diode display panel, such as an inorganic light-emitting diode display panel, an organic light-emitting diode (OLED) display panel, a mini light-emitting diode (mini LED) display panel, a micro light-emitting diode (micro LED) display panel, or a quantum dot (QD) light-emitting diode display panel, but it is not limited thereto.

To summarize the above, in accordance with the embodiments of the present disclosure, a sensing device and a method for manufacturing the same are provided, which can integrate parts of the structures of the elements (e.g., the sensing element and the optical element) in the sensing device. Therefore, the number of photomasks used in the manufacturing process can be reduced, the process can be simplified, or the yield can be improved. Moreover, in accordance with some embodiments, the electrode design of the sensing element can be used to reduce the stray capacitance generated between different elements, thereby reducing the equivalent capacitance of the sensing element. Accordingly, the sensitivity of the sensing device can be improved, or the overall performance of the sensing device can be enhanced.

Although some embodiments of the present disclosure and their advantages have been described in detail, it should be understood that various changes, substitutions and alterations can be made herein without departing from the spirit and scope of the disclosure as defined by the appended claims. The features of the various embodiments can be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Thus, the appended claims are intended to include within their scope such processes, machines, manufacture, compositions of matter, means, methods or steps. Moreover, each claim constitutes an individual embodiment, and the claimed scope of the present disclosure includes the combinations of the claims and embodiments. The scope of protection of present disclosure is subject to the definition of the scope of the appended claims. Any embodiment or claim of the present disclosure does not need to meet all the purposes, advantages, and features disclosed in the present disclosure.

What is claimed is:

1. A sensing device, comprising:
- a substrate;
- a first electrode disposed on the substrate;
- a sensing element disposed on the first electrode and electrically connected to the first electrode, wherein the sensing element comprises a plurality of sensing units that are separate from each other; and
- a second electrode disposed on the sensing element and electrically connected to the sensing element;
- wherein the second electrode comprises a first aperture, and the first aperture overlaps with the sensing element,
- wherein the first electrode comprises a hollow area, the hollow area overlaps with a pitch between the plurality of sensing units, and the hollow area penetrates the first electrode.

2. The sensing device as claimed in claim 1, wherein the second electrode comprises a plurality of first apertures, and the plurality of first apertures overlap with the respective plurality of sensing units.

3. The sensing device as claimed in claim 1, wherein the second electrode is made of a metal material.

4. The sensing device as claimed in claim 1, wherein the second electrode is used to provide a common voltage.

5. The sensing device as claimed in claim 1, further comprising:
- a light-shielding layer disposed on the second electrode, wherein the light-shielding layer comprises a second aperture, and the second aperture overlaps with the first aperture.

6. The sensing device as claimed in claim 1, further comprising:
- a microlens disposed on the second electrode and overlapping with the first aperture.

7. A sensing device, comprising:

a substrate;

a first electrode disposed on the substrate;

a sensing element disposed on the first electrode and electrically connected to the first electrode, wherein the sensing element comprises a plurality of sensing units that are separate from each other; and a second electrode disposed on the sensing element and electrically connected to the plurality of sensing units;

wherein at least one of the first electrode and the second electrode comprises a hollow area, the hollow area overlaps with a gap between the plurality of sensing units, and the hollow area penetrates the first electrode or the second electrode.

8. The sensing device as claimed in claim 7, wherein the second electrode is made of a metal material.

9. The sensing device as claimed in claim 8, wherein the second electrode comprises a plurality of first apertures, and the plurality of first apertures overlap with the respective plurality of sensing units.

10. The sensing device as claimed in claim 8, wherein the second electrode is used to provide a common voltage.

11. The sensing device as claimed in claim 7, further comprising:

a light-shielding layer disposed on the second electrode, wherein the light-shielding layer comprises a plurality of second apertures, and the plurality of second apertures overlap with the respective sensing units.

12. The sensing device as claimed in claim 7, further comprising:

a microlens disposed on the second electrode and overlapping with the plurality of sensing units.

13. A method for manufacturing a sensing device, comprising:

providing a substrate;

forming a first electrode on the substrate;

forming a sensing element on the first electrode, and the sensing element is electrically connected to the first electrode, wherein the sensing element comprises a plurality of sensing units that are separate from each other; and forming a second electrode on the sensing element, and the second electrode is electrically connected to the sensing element;

wherein the second electrode comprises a first aperture, and the first aperture overlaps with the sensing element, wherein at least one of the first electrode and the second electrode comprises a hollow area, the hollow area overlaps with a gap between the plurality of sensing units, and the hollow area penetrates the first electrode or the second electrode.

14. The method for manufacturing a sensing device as claimed in claim 13, wherein the second electrode is made of a metal material.

15. The method for manufacturing a sensing device as claimed in claim 13, further comprising:

forming a light-shielding layer on the second electrode, wherein the light-shielding layer comprises a second aperture, and the second aperture overlaps with the first aperture.

16. The method for manufacturing a sensing device as claimed in claim 13, further comprising:

forming a microlens on the second electrode, wherein the microlens overlaps with the first aperture.

* * * * *